United States Patent [19]

Rabalais

[11] Patent Number: 5,068,535

[45] Date of Patent: Nov. 26, 1991

[54] TIME-OF-FLIGHT ION-SCATTERING SPECTROMETER FOR SCATTERING AND RECOILING FOR ELECTRON DENSITY AND STRUCTURE

[75] Inventor: J. Wayne Rabalais, Houston, Tex.

[73] Assignee: University of Houston - University Park, Houston, Tex.

[21] Appl. No.: 320,213

[22] Filed: Mar. 3, 1989

Related U.S. Application Data

[63] Continuation of Ser. No. 164,530, Mar. 7, 1988, abandoned.

[51] Int. Cl.[5] ...................... H01J 37/252; H01J 49/44

[52] U.S. Cl. .................................... 250/309; 250/305; 250/287

[58] Field of Search ......................... 250/309, 305, 287

[56] References Cited

U.S. PATENT DOCUMENTS 4,778,993 10/1988 Waugh ................................ 250/309

OTHER PUBLICATIONS

"New Method for Metastable Ion Studies with a Time of Flight Mass Spectrometer . . . . ," Della-Negra et al., Anal. Chem., vol. 57, No. 11, pp. 2035-2040 (1985).

"Cf-Plasma Desorption Mass Spectrometry," Sundqvist et al., Mass Spectrometry Reviews, vol. 4, pp. 421-460 (1985).

Brochure entitled "The 252 Cf Plasma Desorption Mass Spectrometer," distributed by Kratos Analytical, a division of Spectros, Ramsey, New Jersey.

"Californium-252 Plasma Desorption Time of Flight Mass Spectroscopy of Proteins," Sundqvist et al., Biomedical Mass Spectrometry, vol. 11, No. 5, pp. 242-257, (1984).

"Comparison of 252 Californium Plasma Desorption and Fast Atom Bombardment Mass Spectrometry for Analysis of Small Peptides," Fohlman et al., Biomedical Mass Spectrometry, vol. 12, No. 8, pp. 380-387 (1985).

"A Versatile Target Manipulator for Use in Ultra-High Vacuum," Bronckers et al., Nuclear Instruments and Methods, vol. 179, pp. 125-130 (1981).

"Surface Structure Analysis of Oxidized Fe(100) by Low Energy Ion Scattering," Van Zoest et al., Surface Science, vol. 182, pp. 179-199 (1987).

*Primary Examiner*—Jack I. Berman

*Attorney, Agent, or Firm*—Arnold, White & Durkee

[57] ABSTRACT

There is disclosed a time-of-flight ion-scattering spectrometer which comprises an ultra-high vacuum chamber sized to accommodate a flight path of sufficient length to provide unit mass resolution at all detection positions and which has means for detecting both ions and neutral particles at both continuously variable forward scattering and backscattering angles. Spectra of both neutrals plus ions as well as neutrals only can be obtained in the same experiment. The polar incidence angle, surface azimuthal angle, and scattering (or recoil) angle can all be varied continuously and independently of one another. The associated method, Scattering and Recoiling for Electron Distributions and Structure (SREDS), allows one to determine atomic structure of substrate surfaces, the structure of adsorbate sites, and electron distributions above surfaces. Even light adsorbates such as hydrogen, carbon, and oxygen can be quantitated by this method.

41 Claims, 18 Drawing Sheets

FIG. 2
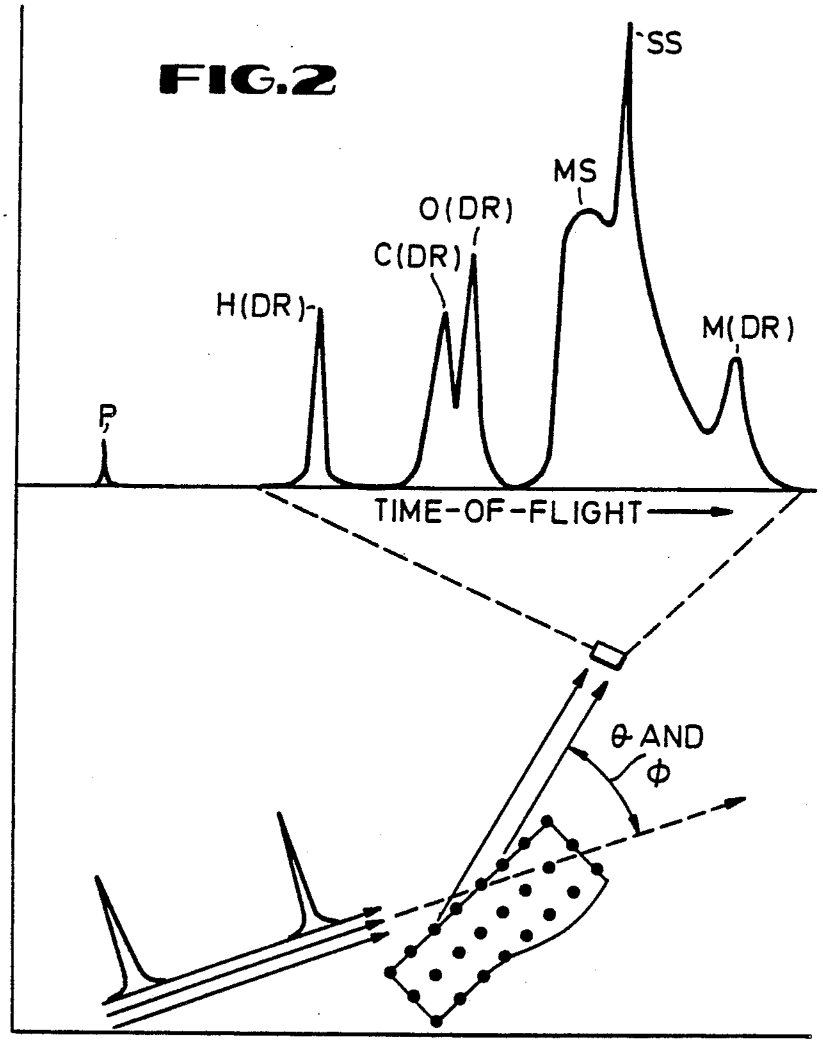
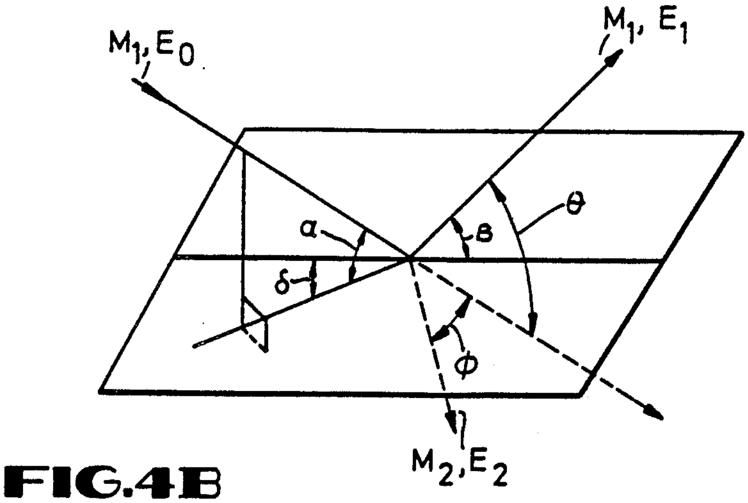
FIG. 4B

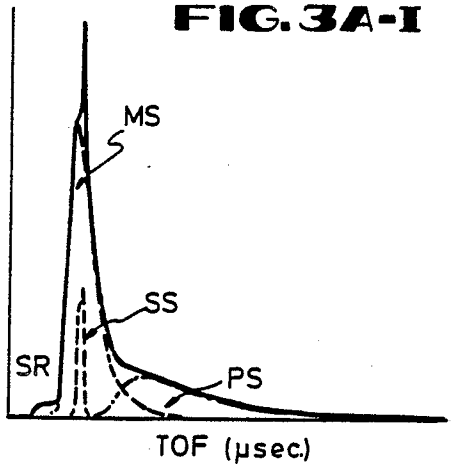
FIG.3A-I
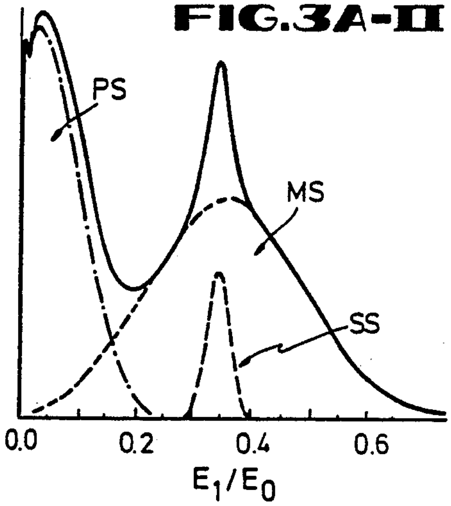
FIG.3A-II
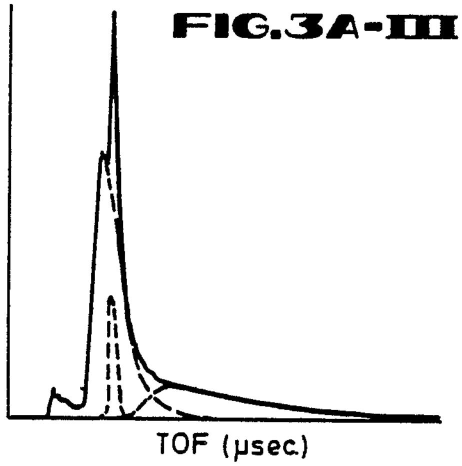
FIG.3A-III
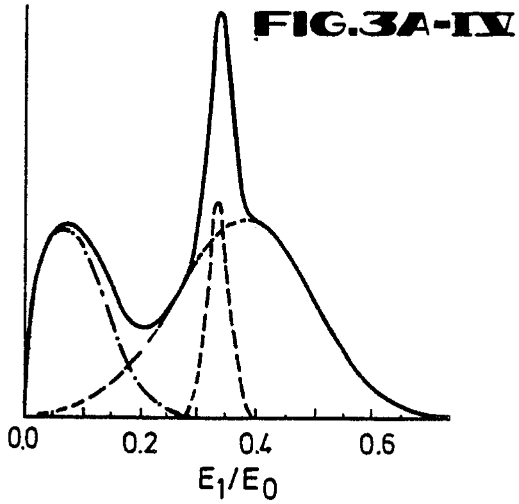
FIG.3A-IV
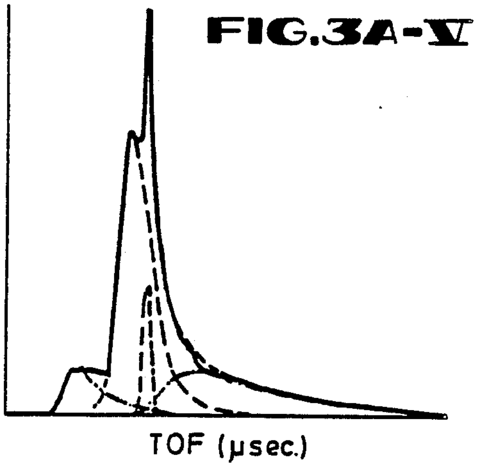
FIG.3A-V
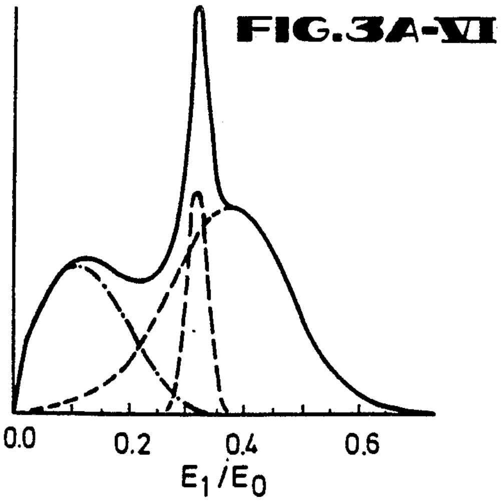
FIG.3A-VI

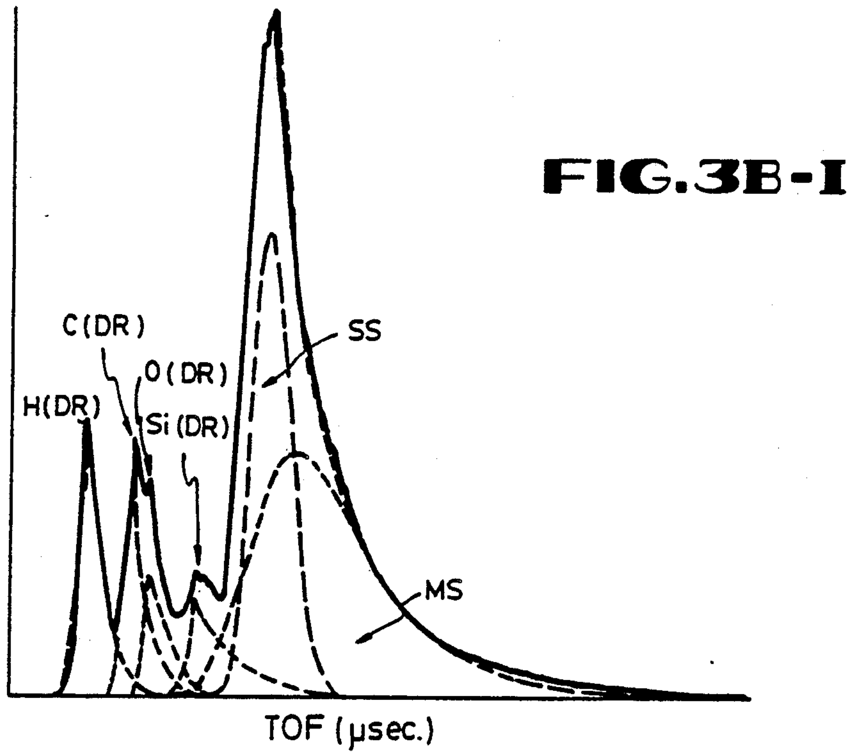
FIG. 3B-I
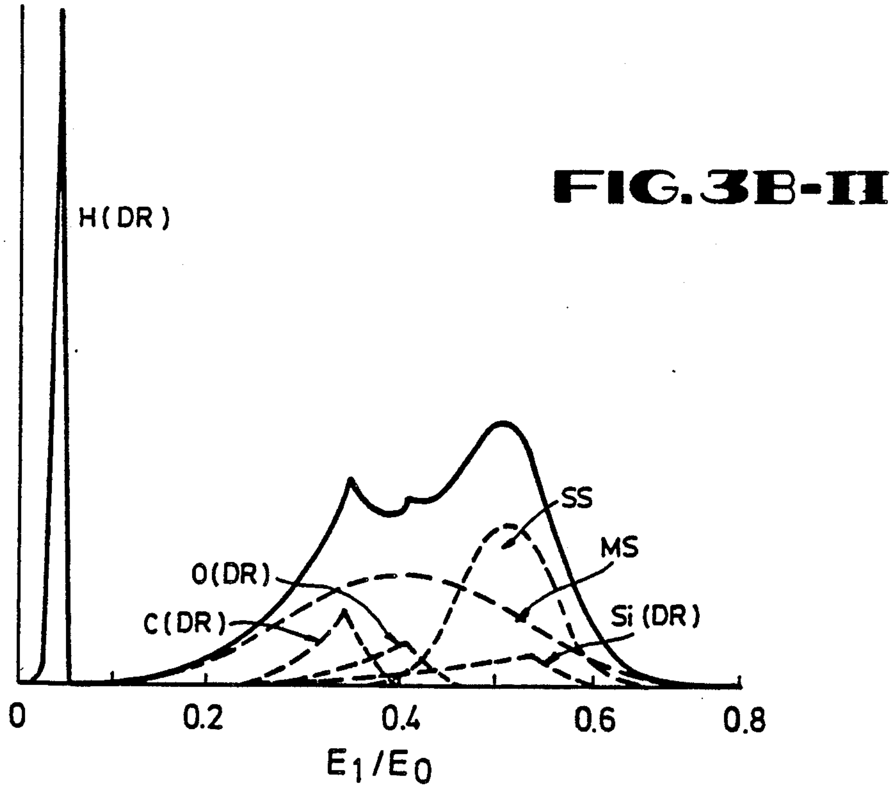
FIG. 3B-II

FIG.4A-I
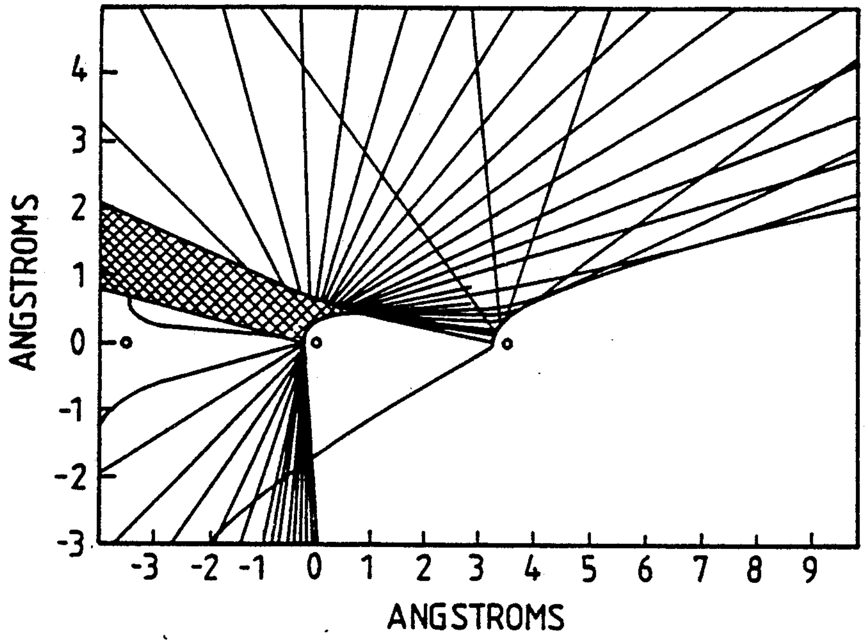
FIG.4A-II
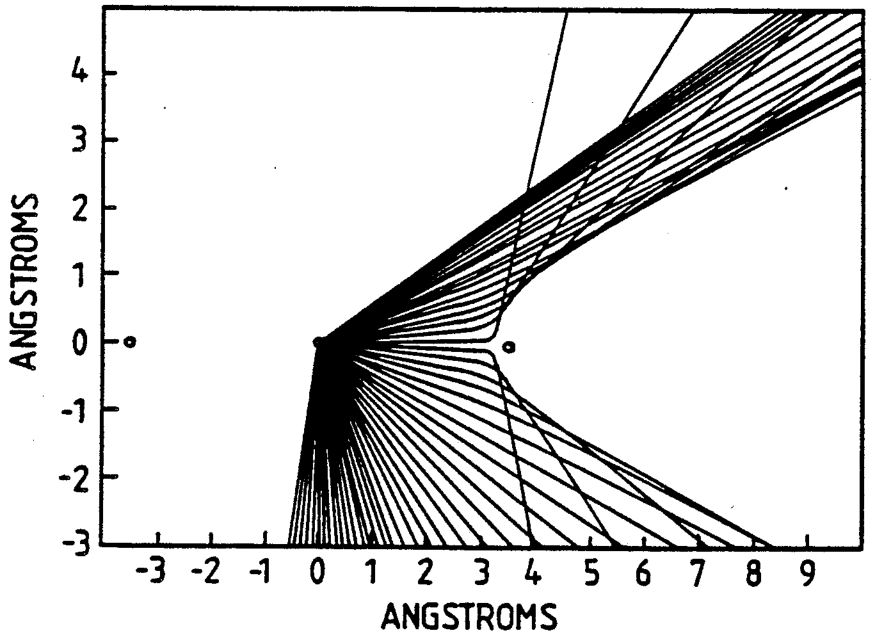

FIG. 5A-I
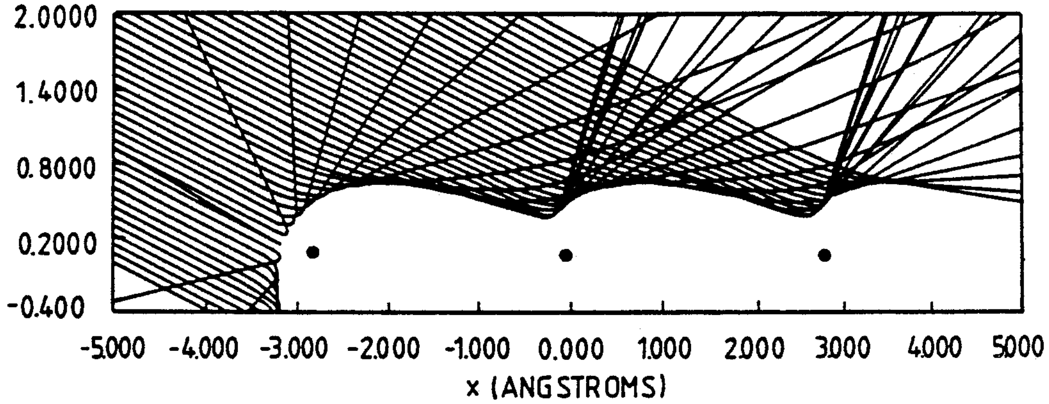
FIG. 5A-II
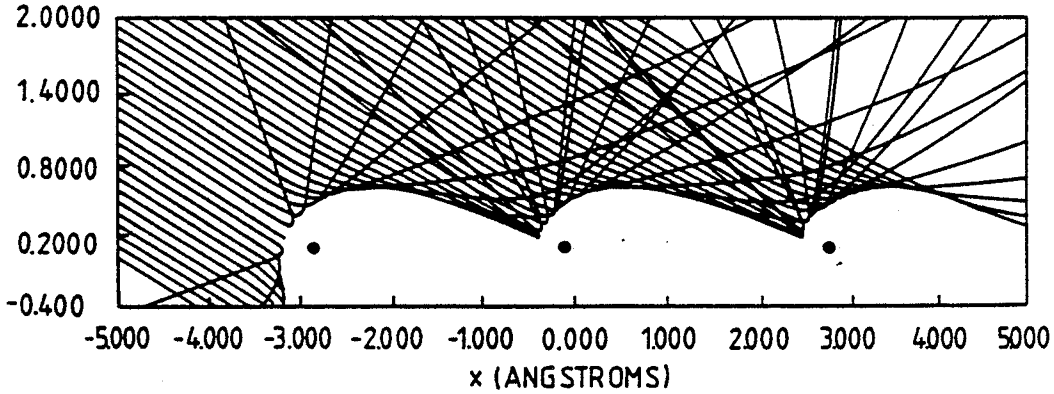
FIG. 5A-III
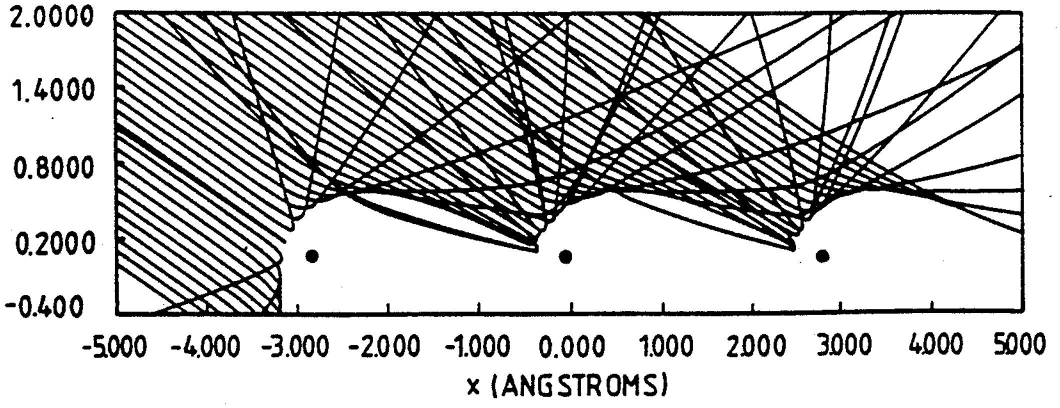

FIG. 5B-I
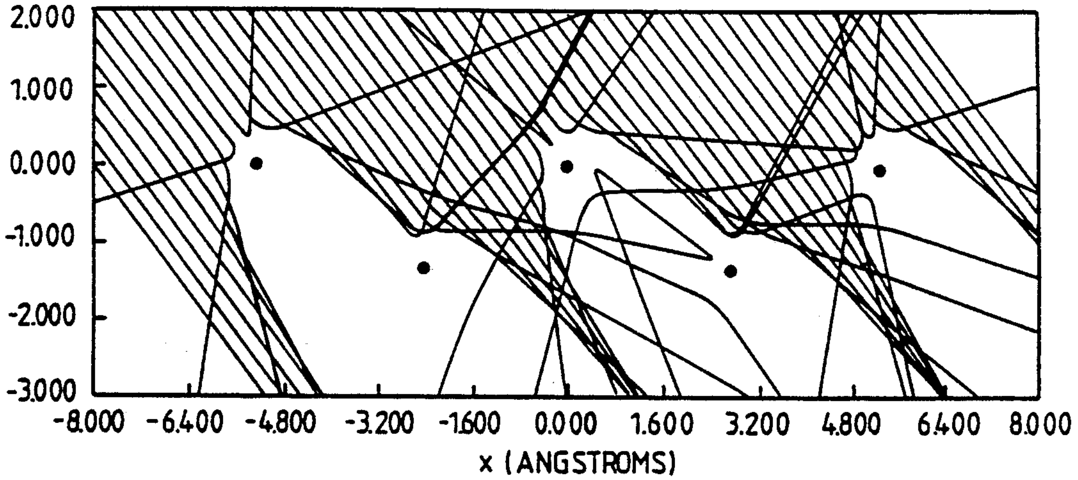
FIG. 5B-II
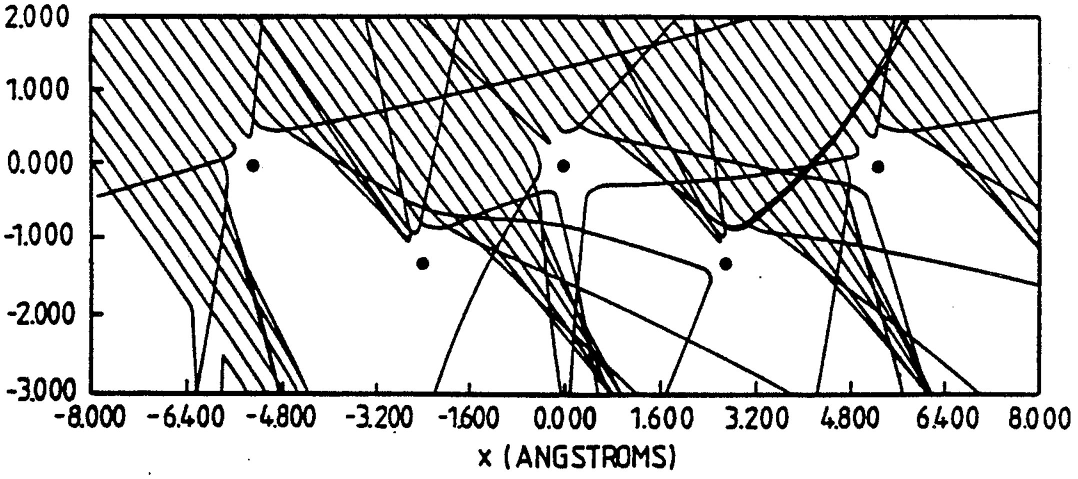

FIG. 6A
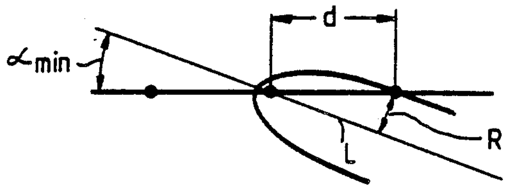
$L = d \cos \alpha_{min}$ $R = d \sin \alpha_{min}$
FIG. 6B
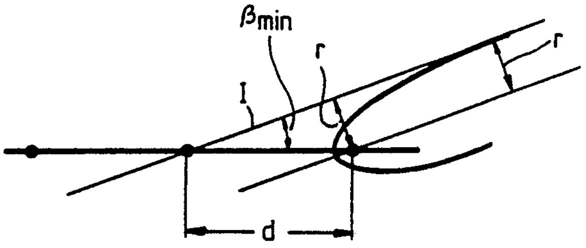
$l = d \cos \beta_{min}$ $r = d \sin \beta_{min}$
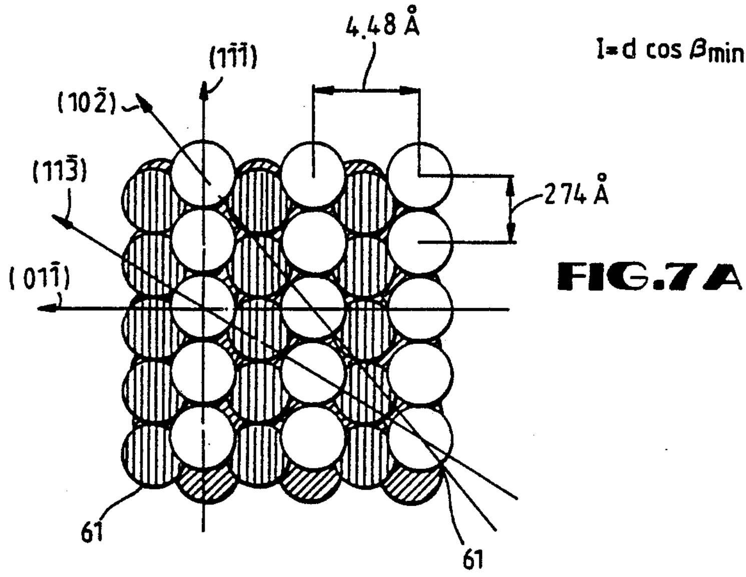
FIG. 7A
FIG. 7B
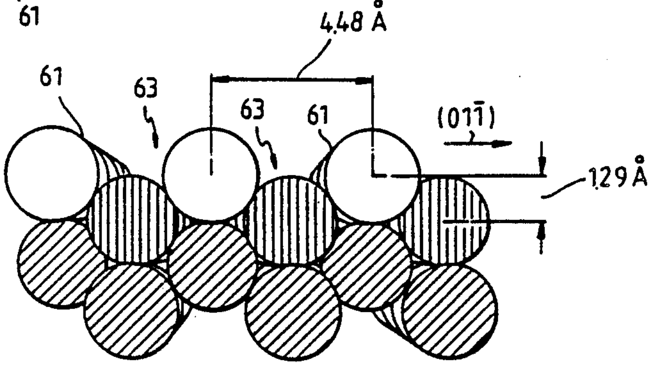

FIG. 9B-I
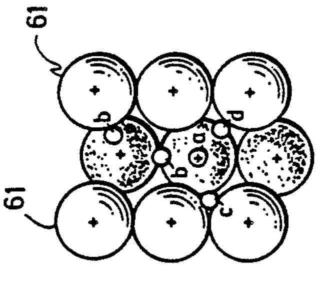
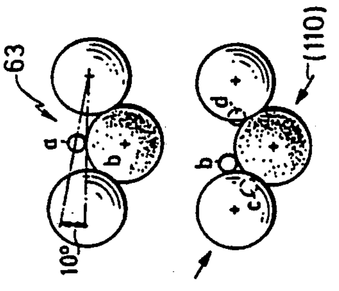
FIG. 9B-II
FIG. 9A-I
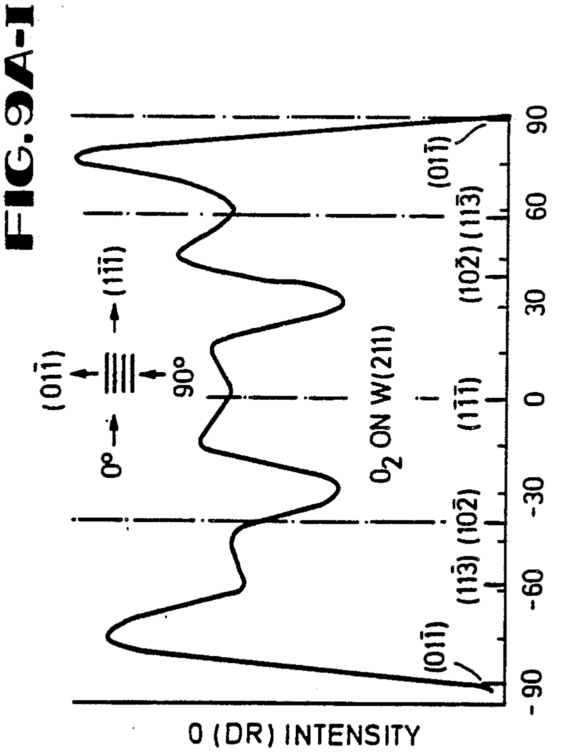
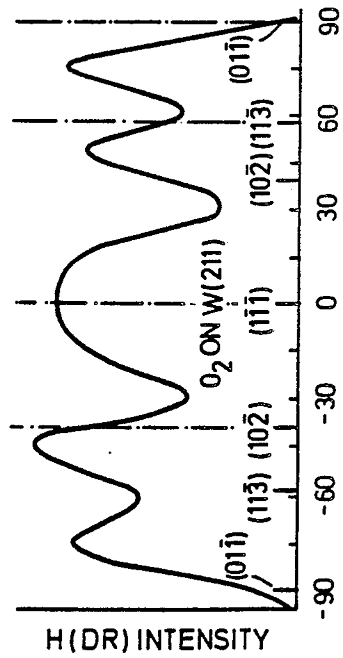
FIG. 9A-II

TIME-OF-FLIGHT ION-SCATTERING SPECTROMETER FOR SCATTERING AND RECOILING FOR ELECTRON DENSITY AND STRUCTURE

This is a continuation of prior co-pending application Ser. No. 164,530, filed Mar. 7, 1988 now abandoned.

BACKGROUND OF THE INVENTION

1. Field of the Invention

This invention relates to surface analysis, and, more particularly, to ion-scattering spectrometry.

2. Description of the Related Art

The technique of ion-scattering spectroscopy typically involves the bombardment of a surface by energetic primary ions during which the energy of the scattered ions is analyzed. Ion-scattering spectrometry (ISS) can be divided into three categories depending on the energy of the incident ion beam: high energy or Rutherford backscattering spectrometry (1-2 MeV), medium energy (100-400 keV), and low energy (0.5-10 keV). Together these three ranges are capable of providing information about specimen surfaces at depths ranging from the outermost atomic layers to a few micrometers.

Typically, measurements are performed by bombarding the surface with a mono-energetic beam of collimated noble gas ions and then determining the energy spectrum of the ions scattered typically at a fixed angle, usually equal to or greater than 90°. Since the scattering process can be treated as a simple binary collision, it can be shown from conservation of energy and momentum considerations that the relationship between the mass of an elastically scattered ion $M_p$ and the mass of a target atom $M_t$ for a scattering angle of 90° is given by:

$$\frac{E_1}{E_0} = \frac{M_t - M_p}{M_t + M_p}$$

where $E_1$ and $E_0$ are the energies of the scattered and incident ions, respectively. For instance, for the scattering of helium, the energy spectrum becomes a mass scale, making it possible for conventional ISS to identify all elements except hydrogen and helium.

For low energy ISS, the variation of sensitivity with atomic mass is generally less than one order of magnitude, and detection limits are on the order of $10^{-2}$ to $10^{-3}$ monolayers. The only important energy loss is due to binary collisions. This leads to a very simple spectrum for low energy ion-scattering where the energy loss is directly related to the ratio between the mass of the bombarding ion and the mass of the scattering atom. Low energy ISS yields information only about the outermost atomic layer, since ions that penetrate that layer are generally neutralized by electrons in the solid and are subsequently not passed by conventional energy analyzers. Depth information is generally obtained by repeated analysis, such that the bombarding ions are allowed to sputter away layers of the surface and expose succeeding layers to analysis. Alternatively, an ion-scattering spectrometer may be provided with an auxiliary sputtering ion gun for the removal of surface layers.

Ion-scattering spectroscopy is one of the most rapidly developing techniques in surface science today because it complements diffraction techniques because, in ion-scattering spectroscopy, a classical particle (an ion) and simple classical concepts ("shadowing" and "blocking") are used. A repulsive scattering potential leads to a region behind each atom into which no ion can penetrate. This region is called a shadow cone and atoms located inside the con of another target atom cannot contribute to the scattering process. Atoms that are either scattered or recoiled from a surface can also be deflected by neighboring surface atoms. These deflections result in blocking cones about neighboring atoms which tend to limit atom ejection at specific angles. The angles and the energies $E_1$ and $E_2$ following a collision event can be expressed in terms of an impact parameter p, which is the distance of closest approach of the projectile and target atom if no scattering occurred. Ions with a small impact parameter p are scattered through large angles while ions with large p are only slightly deflected. This gives rise to the shadowing and blocking cones. Analytical formulas have been developed for calculating the dimensions of shadowing and blocking cones in binary collisions. See, e.g., *Surface Sci.*, 141, 549 (1984).

As a result of using a classical particle and classical concepts, ion-scattering spectroscopy provides direct information on the relative positions of atoms in a surface region, although it is generally difficult to analyze a surface atomic structure fully by this technique alone. One of the most significant problems with ISS as an analytical tool is that they employ magnetic or electrostatic analyzers. These types of analyzers detect scattered ions which are only a small fraction of the total scattered particles. Scattered neutrals are not detected. Therefore, the technique suffers from poor sensitivity.

Moreover, ISS is a destructive technique because relatively high ion doses are required to generate the ion flux needed for detection. Conventional ISS usually requires potentially damaging ion doses (approximately $10^{15}$ ions per square centimeter) to obtain a spectrum since (1) the technique detects only ions and disregards neutrals which often constitute more than 90% of the scattered flux, and (2) single channel devices, such as electrostatic energy analyzers, are typically used for data collection. Buck and coworkers have shown that both of these shortcomings can be overcome by using (1) a multiplier that is sensitive to both neutrals and ions, and (2) a pulsed beam with time-of-flight (TOF) analysis which collects particles of all energies concurrently in a multi-channel mode.

Aono and coworkers have demonstrated a technique called impact collision ion-scattering spectroscopy (ICISS) for analyzing the structure of surface atomic vacancies including the displacement of surrounding atoms. ICISS also analyzes the concentration and chemical activity of surrounding atoms, including the geometry of chemisorbed species. *Phys. Rev. Letters*, 49, 567 (1982). ICISS is a specialized form of conventional low energy ion-scattering spectroscopy with respect to the experimental scattering angle. The scattering angle is chosen to be close to 180~ so that the impact parameter p is nearly zero. Therefore, scattered ions that have made head-on collisions against target atoms are observed. The most striking characteristic of ICISS is that the ion-scattering in this specialized condition "sees" just the center (or the close vicinity of the center) of each target atom because of the small value of the impact parameter p.

As previously mentioned, an atom in an ion beam forms a shadow called a shadow cone into which no incident ion can penetrate, and any atom concealed by this shadow cone does not contribute to ion-scattering. By virtue of the characteristic mentioned above, ICISS can determine the shape of the shadow cone and the atomic geometry of surfaces quantitatively using such shadowing effects among the surface atoms. Stated another way, the backscatter mode of ICISS eliminates the blocking phenomenon observed in conventional ISS leaving only the shadowing effect, and, thus, simplifies the analysis. The ICISS technique detects only ions and cannot separate atomic structure effects from electron neutralization effects. Therefore, the data is ambiguous. Aono and coworkers did, however, demonstrate that it was possible to obtain electron density distributions above surfaces using ion-scattering spectrometry.

Alkali metal ions have been used in ion-scattering spectrometry in place of the noble gas ions that are most commonly employed as the incident beam. In 1984, Niehus demonstrated that alkali metal ions could be substituted for noble gas ions to improve the sensitivity of ICISS. The low ionization potential of the alkali metals means that more of the incident ions survive the collision with the surface as ions, i.e., a smaller fraction of the incident ion flux is neutralized in the collision with the sample surface. This leads to higher sensitivity for conventional ion-scattering spectrometers which detect only charged species. Unfortunately, when this technique is used, a significant number of the impinging alkali metal ions deposit on the sample surface, and, thus, contaminate it. Moreover, like conventional ISS, the signal is determined solely by the scattered ion flux, so the technique cannot be quantitative.

Aono and coworkers demonstrated that ion-scattering spectrometry could be used to gain information on the spatial distribution for surface electrons, i.e., surface electron densities. Because Aono and coworkers were detecting only ions, neutralization effects in the spectra were superimposed on the atomic structure effects. These various effects could not be separated to provide accurate analysis. Aono and coworkers obtained information on electronic distributions by measuring how the scattered ion yields change as angles were varied. However, if only ions are detected and if there are changes in the intensities of the detected ions, ICISS cannot determine if the changes in the ion intensities come from changes in electron neutralization probabilities, from atomic structure effects, or from a combination of the two. Therefore, ICISS cannot separate atomic structure an electron density contributions to the ion-scattering yield. But this work did demonstrate that it was possible to get electron density distributions above surfaces (60–100% versus less than 20% for noble gas ions).

At present, the only known energy analysis method which detects both ions and neutrals is the time-of-flight analyzer. Unfortunately, time-of-flight analyzers commonly have relatively poor resolution compared to electrostatic and magnetic analyzers. However, the resolution of a time-of-flight analyzer may be improved by providing a longer flight path length. Providing a sufficiently long flight path for a time-of-flight ion-scattering spectrometer is difficult because it significantly increases the total evacuated volume of the instrument. This poses both fabrication and pumping problems.

In 1984, Buck and coworkers demonstrated that the time-of-flight technique could be used to get very high sensitivity in ion-scattering spectrometry by detecting of both ions and neutrals using a detector which is sensitive to both ions and fast neutrals, such as a channel electron multiplier. See, *Surface Sci.*, 141, 549 (1984). This technique eliminated the problem of not knowing how much neutralization occurred at the sample surface and rendered the technique quantitative. This technique was also used to obtain atomic structure analysis of surfaces. Only scattering rather than recoiling was used however.

For the purposes of this disclosure, the term "recoil" refers to phenomenon involving dislodged surface species, and the term "scattering" refers to reflection of the primary ion beam. Both recoiling and scattering may involve ions as well as neutrals, but most commonly recoiled species will be neutrals and scattered species will be ions.

In 1987, van Zoest and coworkers in Holland showed that a time-of-flight analysis of scattered and recoiled particles, which detected the neutrals and the ions, could be used to obtain information on atomic structure. See *Surface Sci.*, 109, 239 (1981). However, the path length of the instrument used in these studies was relatively short and the resolution was insufficient to discriminate recoiled and scattered particles.

SUMMARY OF THE INVENTION

In accordance with the present invention, there is provided a spectrometer system capable of performing a simultaneous determination of scattering and recoiling by time-of-flight analysis for determining surface electron distributions and surface atomic structure. The spectrometer system makes possible the use of a new technique for the analysis of surfaces. We will refer to this technique a "scattering and recoiling for electron distribution and structure" or "SREDS."

In one preferred embodiment, the spectrometer comprises a relatively large vacuum chamber which is substantially semicircular in cross section. Means are provided for the introduction of a pulsed ion beam which is adapted to impinge upon a sample surface suspended at the center of the semicircular vacuum chamber. A detector, which is preferably a channel electron multiplier, can be moved along an arc at the periphery of the semicircular vacuum chamber. Thus, the scattering, azimuthal, and beam incidence angles may all be varied continuously and independently. Moreover, because the instrument employs the time-of-flight technique for energy analysis, both charged and neutral species can be detected. Means are also provided for deflecting charged species away from the detector to permit the user to determine ion fractions.

The spectrometer system and method enables even light adsorbates such as hydrogen, carbon, and oxygen to be analyzed efficiently and directly as recoils. Preferably, ion doses of only about $10^{11}$ ions/$cm^2$ are required for spectral acquisition, and spectral acquisition times are preferably in the range of about 5 to about 20 seconds.

Advantageously, in accordance with another aspect of the present invention, the spectrometer permits sources and detectors for conventional surface analytical techniques to be included in the system. Such techniques include Auger electron spectroscopy (AES), x-ray photoelectron induced AES, x-ray photoelectron spectroscopy (XPS), low energy electron diffraction (LEED), and electrostatic analysis (ESA) of scattered and recoiled ions. Means are also provided for residual gas analysis by mass spectrometry.

BRIEF DESCRIPTION OF THE DRAWINGS

FIG. 2 is a schematic diagram of the scattering and direct recoiling processes. A pulsed primary ion beam is shown in the lower panel of the figure impinging on a sample from the left and scattered and recoiled particles are detected by an electron multiplier. The time-of-flight spectrum shown in the upper panel of the figure exhibits hydrogen, carbon, oxygen, and metal direct recoil (DR) along with single scattering (SS) and multiple scattering (MS) peaks. The peak labeled (P) corresponds to a uv photon pulse emitted during the collision, it appears at $t=0$ on the abscissa.

FIGS. 3A I–VI shows time-of-flight (TOF) spectra with corresponding energy distributions for $Ar^+$ scattering from a yttrium surface at a scattering angle $\theta=90°$ for $E_0$ values of 3, 5, and 10 keV. The deconvoluted single scattering (SS), multiple scattering (MS), penetration scattering (PS), direct recoil (DR), and surface recoil (SR) components are shown as dashed lines. The ordinate is scattered ion flux.

FIGS. 3BI and 3BII shows a time-of-flight spectrum together with the corresponding energy distribution for $Ar^+$ scattering from a Si(100) surface at a scattering angle $\theta=25°$ and $E_0=4$ keV.

FIGS. 4AI and 4AII shows classical trajectories depicting the shadow cone of an atom in the scattering trajectories and the blocking cone of an atom in the direct recoil trajectories.

FIG. 4B depicts the coordinates used in scattering and recoiling. The recoil trajectory is shown going below the surface plane. If the recoil trajectory goes above the plane, the scattered trajectory goes below the plane.

FIGS. 5AI–III depicts classical trajectories for 4 keV $Ar^+$ scattering along the (111) azimuth of a W(211) crystal at different incident angles $\alpha$. This figure illustrates that backscattering is not at possible at $\alpha=26°$ but becomes possible at $\alpha=27°$.

FIGS. 5BI and 5BII depicts classical trajectories for 4 keV $Ar^+$ scattering along the (113) azimuth of a W(211) crystal at different incident angles $\alpha$. This figure illustrates that for this azimuth, backscattering from the second layer atoms becomes possible at $\alpha=49°$.

FIGS. 6A and 6B shows the relevant dimensions used in shadowing and blocking cone analyses for computing interatomic distance d.

FIGS. 7A and 7B shows top and side schematic views of the W(211) surface. The top view shows various azimuths. The side view corresponds to a plane perpendicular to the surface along the (011) azimuth.

FIGS. 9AI and 9AII shows plots of oxygen O(DR) and hydrogen H(DR) direct recoil intensities as a function of azimuthal angle $\delta$ for $O_2$ (panel A) and $H_2$ (panel B) adsorbed on a W(211) surface.

FIGS. 9BI and 9BII shows schematic top and end views of a W(211) surface with five geometrically different potential adsorbate site positions. Positions a and b are in symmetrical trough sites whereas b', c, and d are asymmetrical trough sites.

DESCRIPTION OF THE PREFERRED EMBODIMENTS

Figure 1:
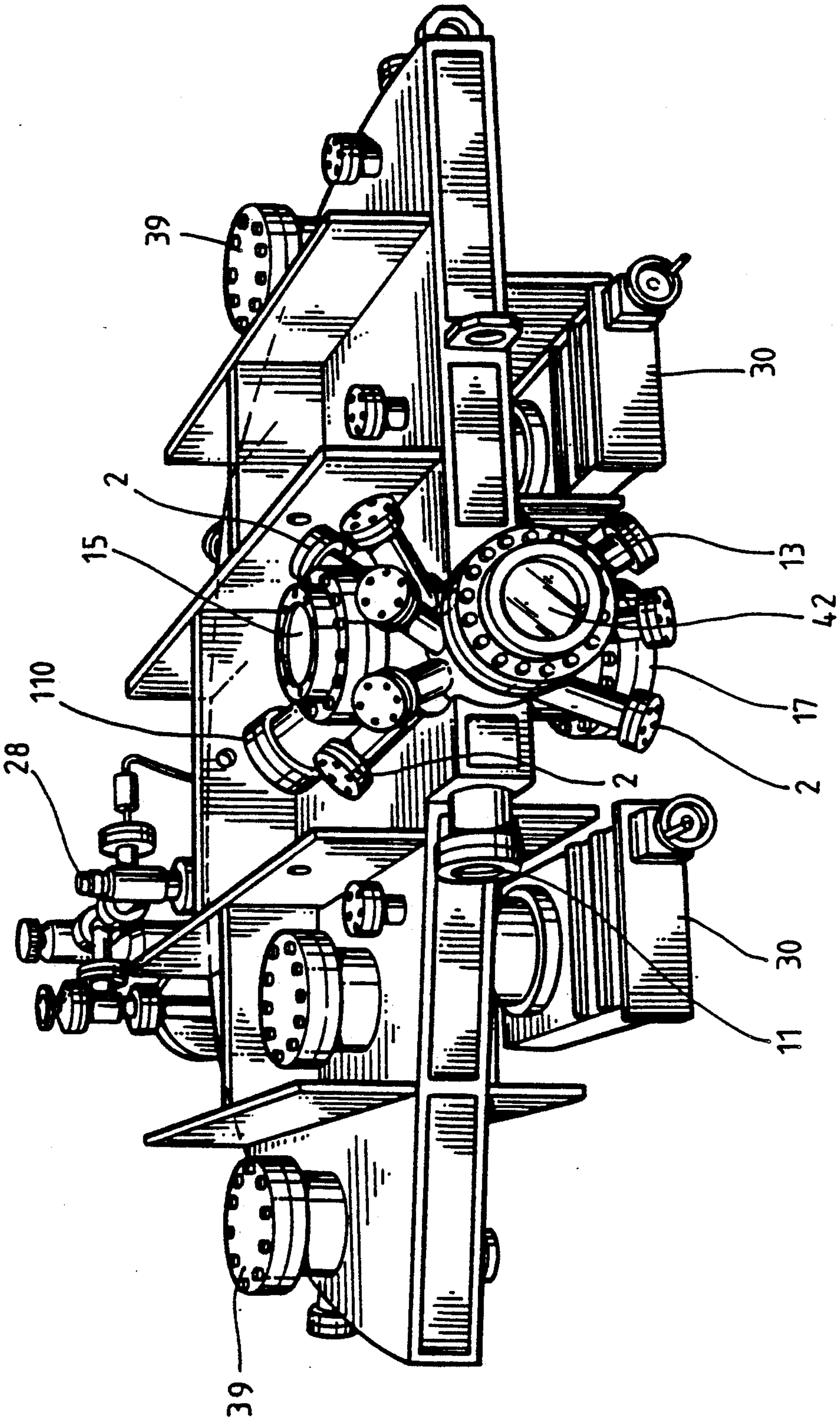
FIG. 1 is a perspective view of the vacuum chamber of the spectrometer system of the present invention showing the mounting flanges for the various sources, detectors, pumps, sample manipulator, detector positioning means and the like. The letters "A" through "L" in the legend on the drawing figure indicate preferred flanges for mounting the listed items to the vacuum chamber.
Figure 12:
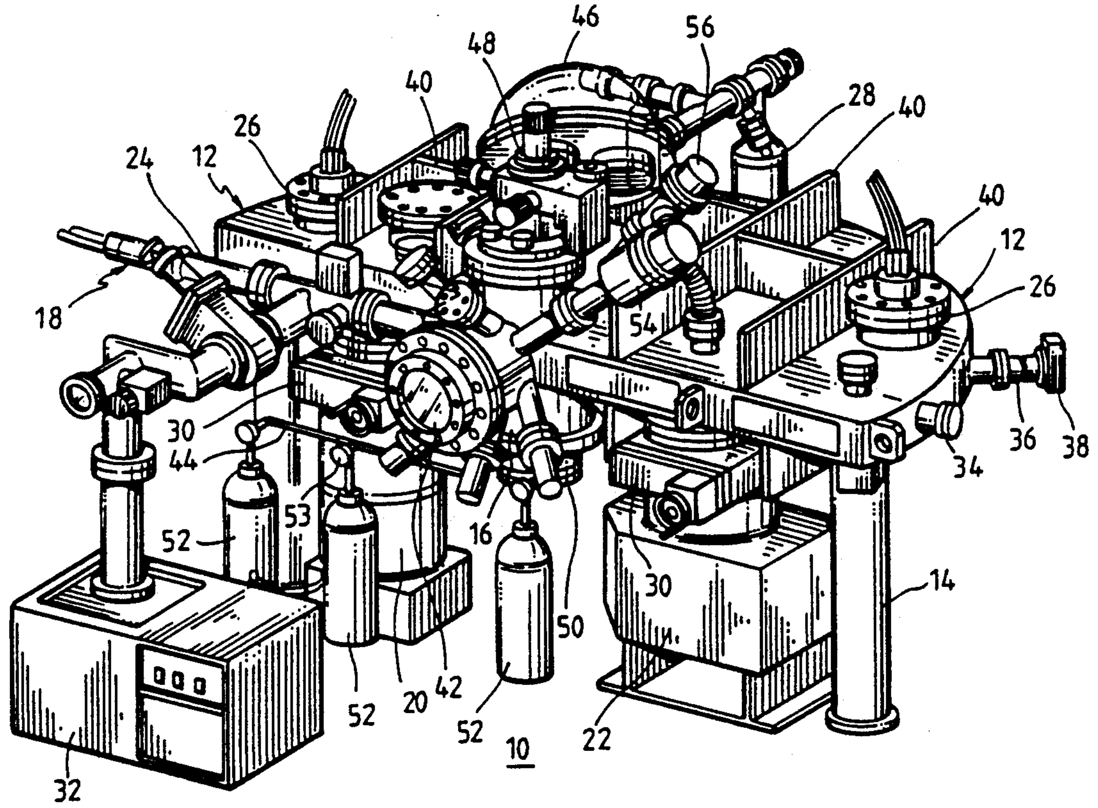
FIG. 12 is a perspective view of a preferred embodiment of the spectrometer of the present invention. This view, unlike that of FIG. 1, shows many of the ancillary components mounted to their corresponding mounting flanges.

Turning now to the drawings and referring initially to FIGS. 1 and 12, a time-of-flight ion-scattering spectrometer is illustrated and generally designated by the reference numeral 10. The spectrometer 10 includes a vacuum chamber 12 having a substantially semicircular cross-section. The vacuum chamber 12 includes two substantially semicircular plates 68 and 70. The Vacuum chamber 12 is supported by tubular support legs 14 which are connected to the bottom plate 70. The top plate 68 is separated from the bottom plate 70 by a vertical wall 72. The wall 72 is preferably welded to the periphery of the plates 68 and 70, and, thus, forms the perimeter of the semicircle. A plurality of reinforcing bars 40 are connected to the outside of the top and bottom plates 68 and 70 in an appropriate arrangement to prevent the plates 68 and 70 from bending under the force of the differential pressure created when the vacuum chamber 12 is evacuated.

The top and bottom plates 68 and 70 are roughly symmetrical as to their overall dimensions, and may be most conveniently visualized as modified semicircles. The radius of the semicircle determines the flight path length which ma be achieved in the spectrometer 10. Since resolution is a monotonic function of flight path length, it is advantageous to have a large radius. However, since the total evacuated volume of the spectrometer 10 increases as the square of the radius of the top and bottom plates 68 and 70, there are a number of constraints on increasing the radius. For example, pump requirements and pumping time increase as the evacuated volume increases. Moreover, as the size of the plates 68 and 70 increases, more or larger reinforcing bars 40 are used to prevent significant deflection of the top and bottom plates 68 and 70 under the differential force of atmospheric pressure. It has been found that a radius of about one meter provides adequate resolution for most experiments and a manageable vacuum chamber size.

The height of the wall 72 determines the spacing between the top and bottom plates 68 and 70. Therefore, the volume of the vacuum chamber 12 is determined by the size of the plates 68 and 70 and the height of the wall 72. Preferably, the height of the wall 72 is minimized to reduce the total evacuated volume of the vacuum chamber 12, and, thus, minimize pump requirements and pumping time. The minimum wall height is dictated by the size of the detector and its associated positioning means. Accordingly, it is desirable to minimize the size (more particularly, the height) of these elements. In the preferred embodiment, the wall 72 has a height of about 3 inches.

The vacuum chamber 12 is preferably constructed of electropolished, ½-inch thick 304 stainless steel plate. It is important that the material chosen for the plates 68 and 70 and the wall 72 of the vacuum chamber 12 be non-magnetic so that the flight paths of charged particles within the chamber are not affected by the chamber itself. Furthermore, electropolishing of the inner surfaces of the vacuum chamber 12 is particularly important since there is a relatively large amount of surface area exposed to the ultra-high vacuum and electropolishing minimizes outgassing from the surfaces. Without electropolishing it would be difficult to achieve the ultra-high vacuums needed for analysis of a sample surface.

Figure 13:
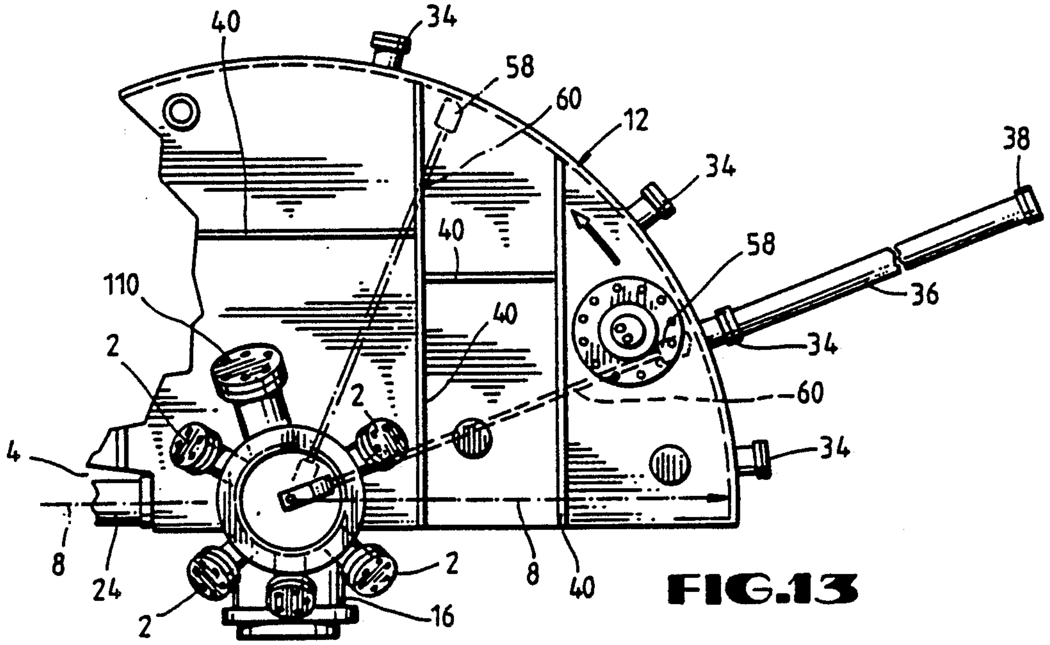
FIG. 13 is a top view of the instrument shown in FIG. 12. Also shown in this figure is the detector in two different positions and a flight path extension tube mounted to one of the peripheral flanges.

The semicircular cross-section of the vacuum chamber 12 is modified by providing a cutout portion 4, which approximates a truncated pie-shaped section, at one extreme of the semicircle. For the purposes of this disclosure, the non-curved portion of the wall 72 will be referred to as the "base" of the semicircle. A slice of the semicircular plates 68 and 70 is cut out near the base, and a port 11 is connected to the wall 72. The port 11 is directed towards the center along the radius of the semicircle, and preferably houses a pulsed ion beam line 24. The ion beam line 24 includes ion gun 18 and ion beam line pump 32 for differential pumping of the ion beam line 24. But for the provisions needed for introduction of the pulsed ion beam, the base would be linear and would be equal in length to the diameter of the substantially semicircular plates 68 and 70. However, inasmuch as it is advantageous to place a sample 78 at the midpoint of the diameter of the semicircular vacuum chamber 12, the cutout portion 4 is required to make room for the ion gun 18 and the other devices in the ion beam line 24, such as deflection plates, lenses, and the like, as shown in FIG. 13. Most preferably, the size of this cutout portion 4 is minimized so that the range of scattering angles that may be observed is maximized. In the preferred embodiment illustrated in FIG. 13, the cutout portion 4 requires about a 10° arc of the semicircle. Thus, the spectrometer 10 can observe scattering angles $\theta$ through an arc of approximately 170°, as will be subsequently described.

A "tee" fitting 16 is attached to the vacuum chamber 12 at the center of the base of the semicircle defined by the plates 68 and 70, such that the long axis of the tee fitting 16 is perpendicular to the diameter and to the plates 68 and 70. Preferably, the tee fitting 16 is welded onto the vacuum chamber 12. A flange is connected to the end of each leg of the tee fitting 16. The middle flange 13 projects perpendicularly outwardly from the base of the semicircle, the top flange 15 projects perpendicularly outwardly from the top plate 68, and the bottom flange 17 projects perpendicularly outwardly from the bottom plate 70. Advantageously, the tee fitting 16 is made from 6.0-inch pipe and each flange 13, 15 and 17 has an 8.0-inch outside diameter. In addition, a plurality of small ports 2 project from the tee fitting 16, both above and below the plates 68 and 70. The small ports 2 are preferably directed towards the center of the base of the semicircle, and used for the attachment of various devices, as will be subsequently described.

Referring briefly to FIG. 4B, before further describing the spectrometer 10, various angles should be defined. For the purposes of this disclosure and as is conventional in the art, $\theta$ designates the scattering angle which is defined as the angle between the flight paths of the scattered incident particles and the incident ion beam. Hence, the scattering angle $\theta$ is twice the ejection angle $\beta$, which is defined as the angle between outgoing beam and sample surface. The angle $\phi$ is used to designate recoil angles. The incidence angle or polar incidence angle $\alpha$ is defined as the elevation angle between the surface of the sample and the incident ion beam. The angle $\delta$ designates the azimuthal angle of the incident beam.

Referring again to FIG. 12, a sample manipulator 48 is mounted on the top flange 15 of the tee fitting 16. The sample manipulator 48 positions a sample 78 at the center of the base of the semicircle, and can rotate the sample 78 about the vertical and azimuthal axes. A detector positioner 50 is mounted on the bottom flange 17 of the tee fitting 16. The detector positioner 50 rotates a detector 38 through the scattering angular range $\theta$. The middle flange 13 of the tee fitting 16 is used for a viewport 42 or for reverse-view LEED optics.

Figure 14:
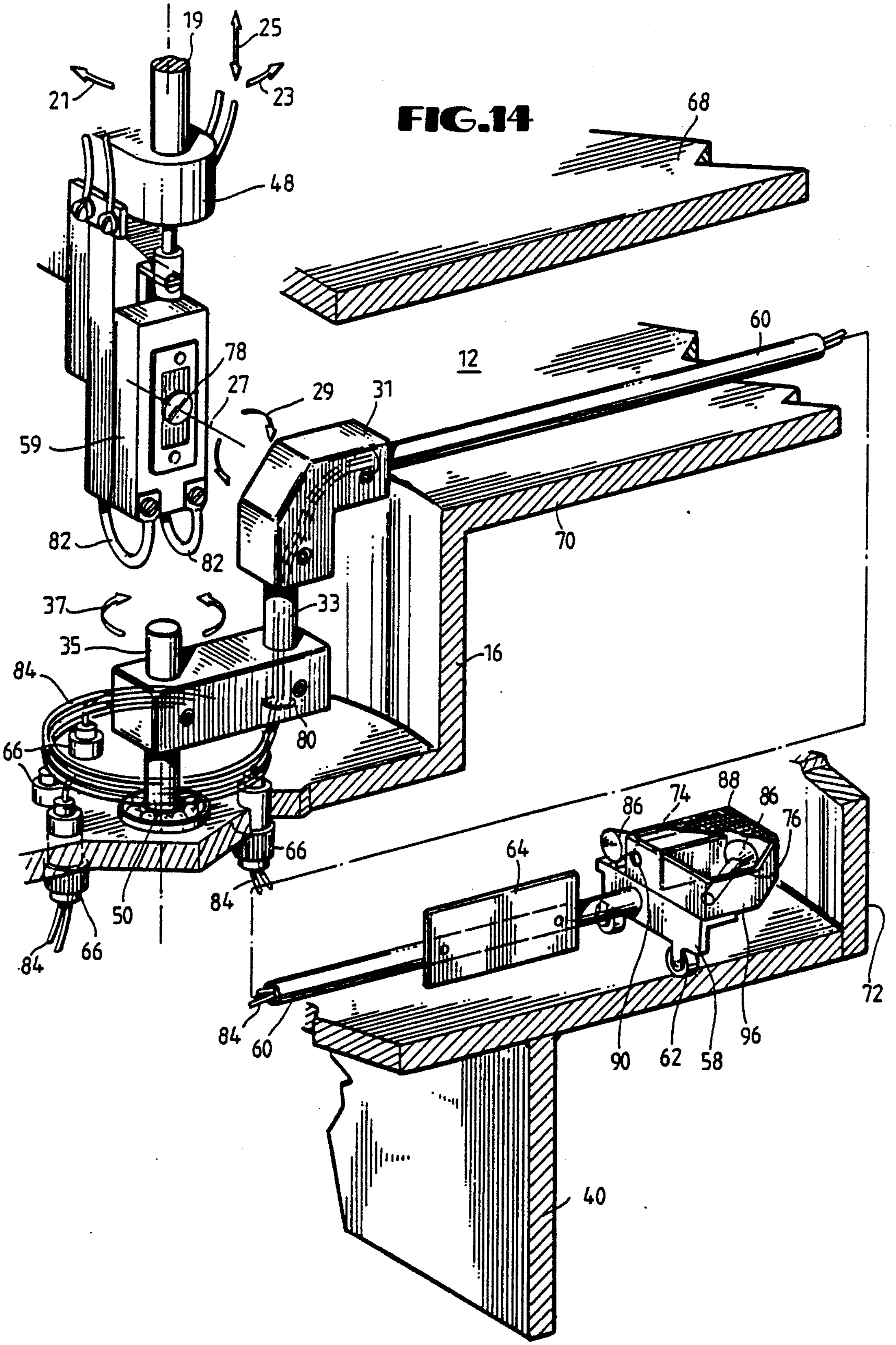
FIG. 14 is a cutaway view of the instrument shown in FIG. 12 showing the sample manipulator and a preferred detector positioner.

FIG. 14 is a cutaway view taken through the tee fitting 16 showing the sample manipulator 48 and the detector positioner 50. The sample manipulator 48 is mounted onto the top flange 15 of the tee fitting 16 such that the sample manipulator 48 extends downwardly into the vacuum chamber 12. When the sample manipulator 48 is properly mounted, the sample surface 78 intersects the diameter line 8. The beam incidence angle $\alpha$ can be varied by rotating the sample manipulator 48 about the rod 19 in the direction of the arrows 21, 23 and 25, which are shown near the top of FIG. 14. The azimuthal angle $\delta$ can be varied by rotating the sample 78 about the axis 27 in the direction of the curved arrow 29.

The detector positioner 50 includes a detector arm 60 that is horizontally disposed between the plates 68 and 70. One end of the detector arm 60 is fixedly connected to on end of an angular arm 31. The other end of the angular arm 31 is fixedly connected to a rod 33. The rod 33, in turn, is fixedly connected to one end of an offset arm 80. The other end of the offset arm 80 is connected to a rod 35 which is pivotally connected to the bottom flange 17. The offset arm 80 and the angular arm 31 are used to provide clearance between detector arm 60 and pivotal rod 35 of the detector positioner 50. The scattering angle $\theta$ is selected by pivoting the detector arm 60 in the direction of the curved arrow 37 to selected positions. Two different positions of the detector arm 60 are shown in FIG. 13 using dashed lines. Preferably, a Huntington Model Pr-275 precision rotary motion feedthrough in the bottom flange 17 of the tee fitting 16 moves the arm 60.

FIG. 13 is a top view of the spectrometer 10 illustrated in FIG. 12. A line 8 indicates the diameter of the circle which is partially defined by the semicircular cross-section of the vacuum chamber 12. The tee fitting 16 is mounted to the vacuum chamber 12 such that its long axis is perpendicular to and intersects diameter line 8. A detector arm 60 is pivotally attached at the junction of the tee fitting 16 and the vacuum chamber 12. As previously mentioned, since the cutout 4 consumes approximately 10° of arc, the detector arm 60 may be moved between the plates 68 and 70 through an arc of approximately 170°. Therefore, all scattering angles $\theta$ in that range may be selected by pivotally moving the detector arm 60.

Figure 15:
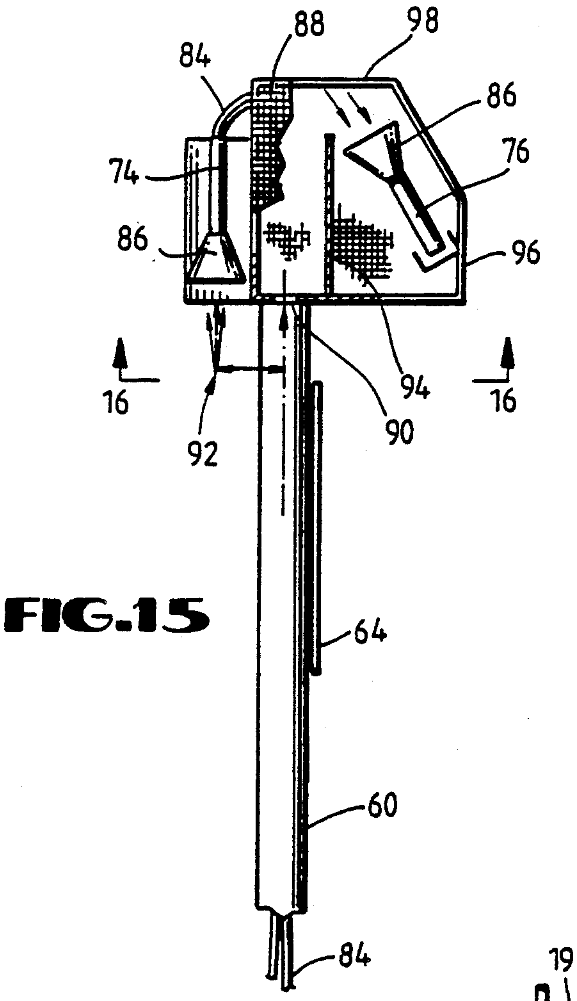
FIG. 15 is a partially cutaway top view of the outer end of the detector positioning arm and detector carriage.
Figure 16:
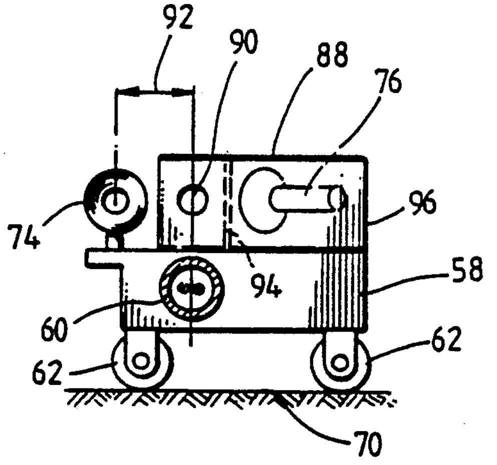
FIG. 16 is a side view of the detector carriage taken along line "16—16" in FIG. 15.

The radially outward end of the detector arm 60 carries two detectors 74 and 76. Preferably, the detectors 74 and 76 are mounted on a carriage 58 as illustrated in FIGS. 15 and 16. The detector carriage 58 may be accessed through a flange 39 that is used to mount a titanium sublimation pump 26. The carriage 58 is equipped with wheels 62 which ride on the inner surface of bottom plate 70. Therefore, the detectors 74 and 76 can be moved to any angle $\theta$ within the range of the spectrometer 10 along a constant radius, and, hence, maintain a constant flight path length. Preferably, the detector arm 60, the angular arm 31, and the rod 33 are formed from a hollow members so that the electrical leads 84 of the detectors 74 and 76 may pass through to the bottom flange 17. The leads 84 are advantageously wrapped around the pivotal rod 35 of detector positioner 50 and then passed through feedthroughs 66 for connection the appropriate electronics. The coil of detector leads 84 about the rod 35 permits pivotal movement of the detector arm 60 without hindrance. Computer controlled stepping motors or other automated means could readily be incorporated for controlling all important angles of interest: the beam incident angle $\alpha$, the azimuthal angle $\delta$, the scattering angle $\theta$, and the recoiling angles $\phi$.

Preferably, the detector 74 is an electron multiplier and is aimed directly at the sample surface 78. The detector 74 includes a detector cone 86 subtending the collection angle. The timing electronics and pulsing sequence are similar to those by Rabalais et al. in *J. Chem. Phys.*, 78, 5250–5259 (1983). The detection of low energy neutrals by a channel electron multiplier is described by Chen et al. in *Nuclear Instruments and Methods in Physics Research,* B16 (1986) 91–95. The teachings of these references are incorporated herein. As shown in FIGS. 15 and 16, the direct-view detector 74 is offset from detector positioning arm 60 by a known amount illustrated by the arrow 92. It is a simple matter to adjust the angular reading from the detector positioner 50 to compensate for this offset. Inasmuch as the incoming particles can sputter the surface of the detector 74, it is desirable to have an indirect-view detector 76. Particles enter the detector chamber via an entrance aperture 90 in a shielding box 96 which surrounds the detector 76. As shown in FIG. 15, the incoming particles dislodge electrons when they impact the back wall 98 of box 96 and these electrons are collected by the cone 86 of indirect detector 76. A partition 94 shields the detector 76 from the flight path of the incoming particles so that they do not deflect into the detector 76 without first impinging on the back wall 98. The shielding box 96 preferably includes top and bottom screen covers 88 and 89 which provide electrical shielding while permitting the box to be evacuated. All components of the detector 50, including the arm 60 and the shielding box 96, are preferably constructed of stainless steel. It is contemplated the back wall 98 may be made from or coated with a more appropriate material to improve sensitivity. This material would be similar in function to that employed for detector cone 86.

Also shown in FIG. 14 is deflector plate 64 that is connected to the detector arm 60. The electrical leads of the detector plate 64 are also passed through tubular detector arm 60 to the appropriate feedthrough 66. When a potential is applied between the walls of the vacuum chamber 12 and the deflector plate 64, charged species are deflected such that they do not reach either detector 74 or 76. Therefore, two different spectra may be obtained in the same experiment: one spectra produced by both ions and neutrals when the deflector plate 64 is at ground potential, and one spectra produced only by neutrals when a potential is applied to deflector plate 64. From this information an ion fraction F may be calculated as:

$$F = \frac{I}{(N + I)} \tag{1}$$

where I is the ions-only flux and N is the neutrals-only flux. I is obtained by subtracting N, measured when the deflector plate 64 is energized, from the total scattered flux (N+I), measured when the deflector plate 64 is grounded.

The ion fraction F is sensitive to the surface electron density. For example, ions plus neutrals may be collected for a period of 20 seconds with the deflector plate 64 at ground potential followed by a equal period of data collection during which a potential is applied to the deflector plate 64 sufficient to deflect all incoming charged particles away from the entrance aperture 90 of the detector 76. This process may be repeated until the required amount of data is collected. Most preferably, the deflector plate 64 will be cycled on and off for equal deflection and non-deflection periods throughout the total data collection time which might typically be on the order of five minutes. In this way, any instrumental variations are averaged out. Preferably, pulse counting is employed in the detector, so that individual particles are detected.

Referring again to FIG. 12, two sorption pumps 28, a turbomolecular pump 20, an ion pump 22, and titanium sublimation pumps 26 are illustrated. Rough pumping is preferably accomplished by the dual sorption pumps 28. The turbomolecular pump 20 and the ion pump 22 are connected to ports (not shown) in the bottom plate 70 via respective gate valves 30. Preferably, the ports in the bottom plate 70 have 8.0-inch outside diameter flanges (not shown) which connect to the gate valves 30. When closed, the gate valves 30 isolate the pumps 20 and 22 from the vacuum chamber 12. When the gate valves 30 are open, the pumps 20 and 22 are used as the main pumps to evacuate the vacuum chamber 12. Preferably, the turbomolecular pump 20 can evacuate the vacuum chamber 12 at a rate of about 450 liters/second and the ion pump 22 can evacuate the vacuum chamber 12 at a rate of about 250 liters/second. The titanium sublimation pumps 26 are attached to two large ports 27 on the top plate 68. The titanium sublimation pumps 26 are used in conjunction with the pumps 20 and 22 to achieve an ultra-high vacuum within the vacuum chamber 12. Ultrahigh vacuums are needed to ensure that the surface of the sample 78 does not become contaminated during an experiment. Surface heaters (not shown) ar glued to the outer walls of the vacuum chamber 12 to bake the system as it is being pumped down. Preferably, the surface heaters are rubber strip heaters that are glued to the walls, and deliver about 12 K watts of power. After baking, the pumps 20, 22 and 26 reduce the pressure within the vacuum chamber 12 to a base pressure of about $1\times10^{-10}$ torr.

Adsorbates are introduced via gas manifold 44 from gas cylinders 52. The gas cylinders 52 are connected to the vacuum chamber 12 through variable leak valves 53. Preferably, the 125 L/s turbomolecular pump 32, that also differentially pumps the ion beam line 24, pumps the manifold 44.

Small flanges 34 project radially from the wall 72 around the arc of the semicircle so that flight paths may be extended at specific angles. Extension tubes 36 with associated detectors 38 can be mounted to the flanges 34 to improve the resolution at selected scattering angles by extending the flight path for the time-of-flight analysis. The length of extension tube 36 and hence the flight path length may be extended to virtually any desired length.

Figure 10:
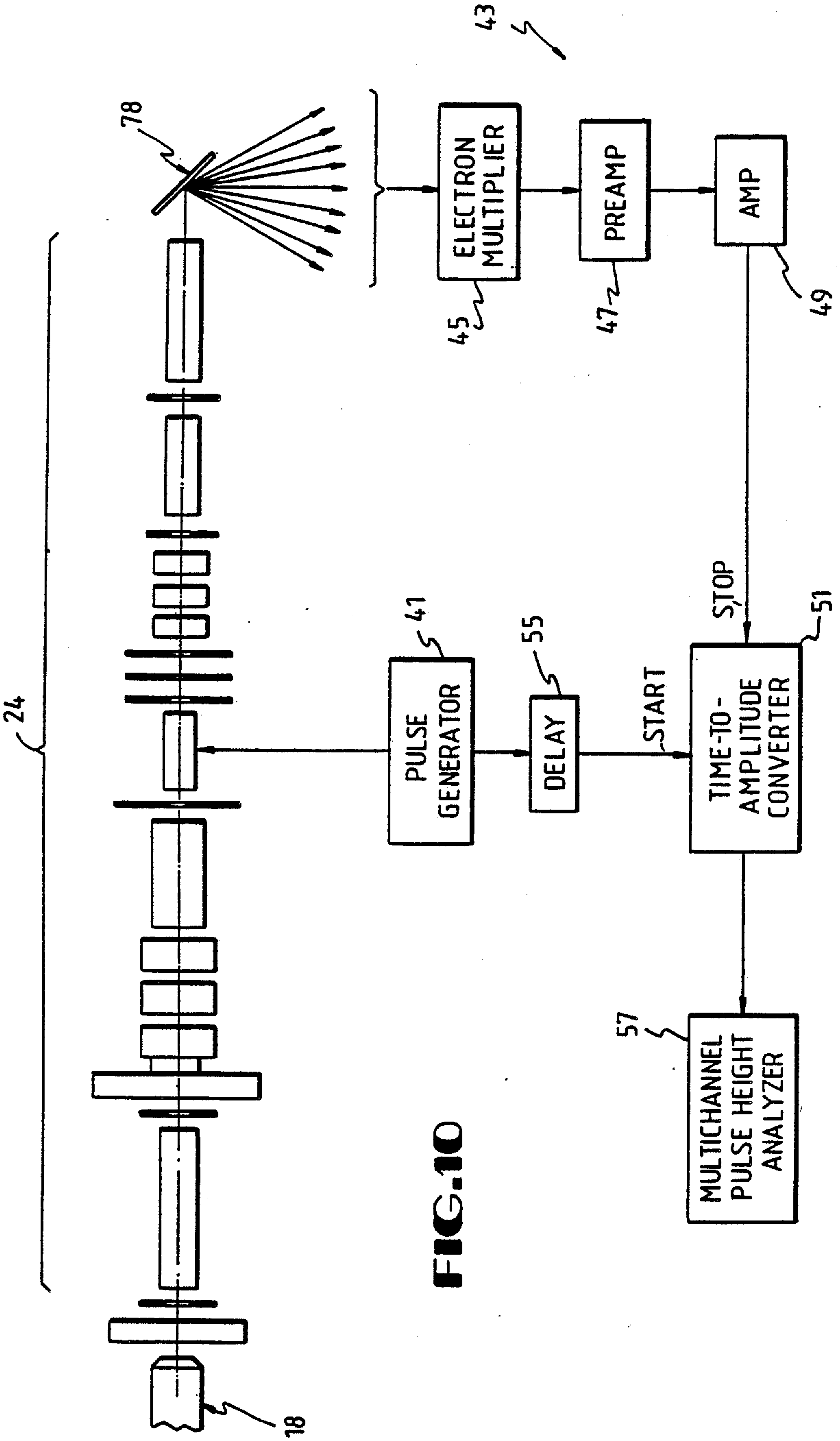
FIG. 10 is a schematic view of the pulsed ion beam line used in a preferred embodiment of the spectrometer of the present invention. Also shown in this figure is a block diagram of the associated timing and detection electronics.
Figure 11A:
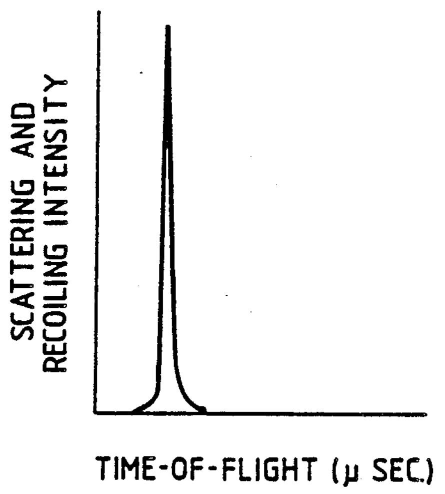
FIGS. 11A–G shows an example of the evolution of direct recoils as a function of scattering angle $\theta$.
Figure 11B:
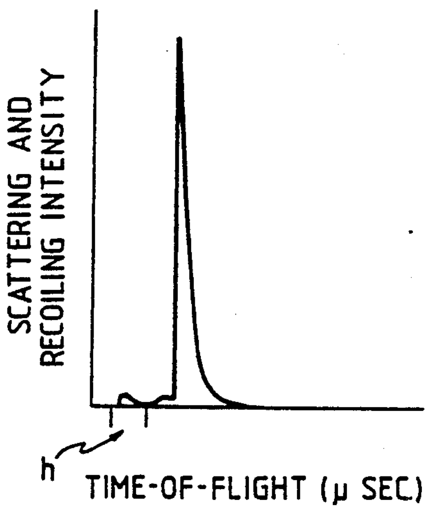
Figure 11C:
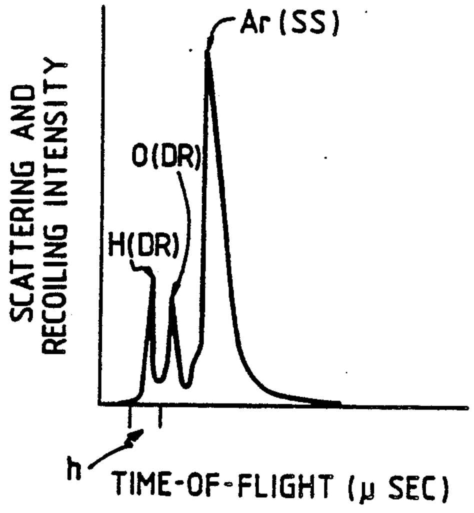
Figure 11D:
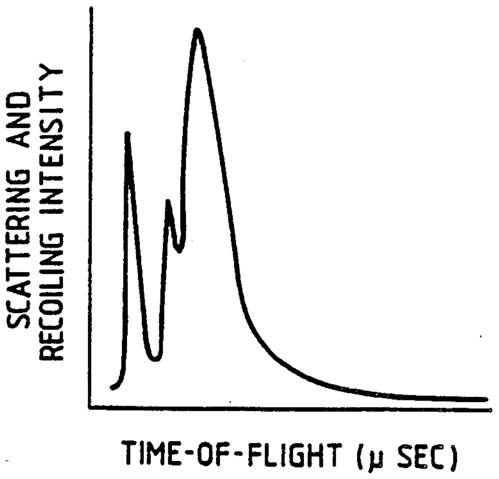
Figure 11F:
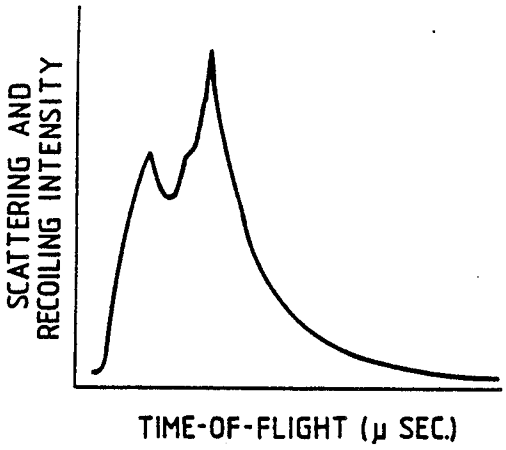
Figure 11E:
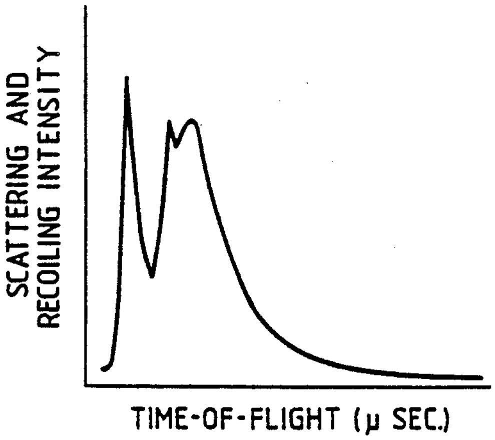
Figure 11G:
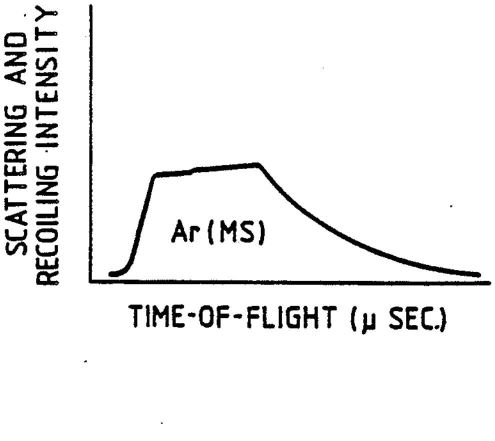

FIG. 10 illustrates the pulsed ion beam line 24 in greater detail. An ion gun 18 is connected to one end of the ion beam line 24. A suitable ion gun is a Perkin-Elmer Model No. 04-191 having a range of 0.1–5.0 KeV. This gun contains an off-axis filament which precludes fast neutrals from entering the ion beam line 24. The off-axis aperture for eliminating fast neutrals that was used previously is not required here inasmuch as the ion source uses off-axis filaments which eliminate line-of-sight with the sample. Ion pulse widths of <50 ns with average current densities up to 10–50 $nA/cm^2$ are obtainable with this system.

A pulsed ion beam is generated by applying a potential to pulse plates D in FIG. 10. As illustrated, a pulse generator 41 is electrically connected to the pulse plates D, and is adapted to deliver the appropriate potential to the pulse plates D. The pulse plates D sweep the ion beam past a pulse aperture E, and, thus, produce a pulse which impinges on sample surface 78. The ion pulse deflects of off the sample surface 78, and the deflected ion pulse is received by a detector 43. The detector 43 preferably includes an electron multiplier 45, and amplifier 47, and a preamplifier 49. Therefore, the detector 43 delivers a signal correlative to the detected ion pulse to the time-to-amplitude converter 51. A preferred channel electron multiplier 45 is manufactured by Galileo Electro Optics as Model 4219.

A delay 55 in the electronics also receives the pulse from the pulse generator 41. The delay 55 compensates for the time needed for the ion pulse to travel from the aperture E to the sample surface 78. In response to this pulse, the delay 55 enables a time-to-amplitude converter 51 when the ion pulse is expected to reach the sample surface 78. After the delay, the time-to-amplitude converter 51 receives the signal from the detector 43, and generates a pulse having a height that is proportional to the time of flight of the scattered or recoiled species from the sample surface 78 to the detector 43. The converter 51 delivers the generated pulse to a multichannel pulse height analyzer 57. The multichannel pulse height analyzer 57 determines the time for the pulses as the spectral data is collected.

Figure 17:
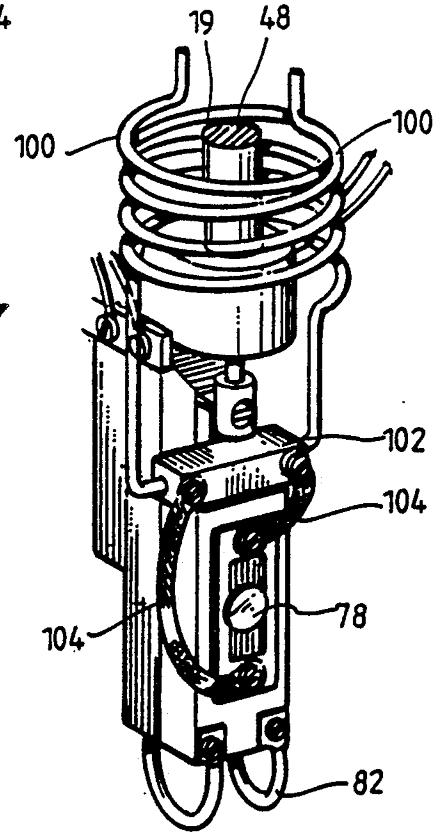
FIG. 17 is a perspective view of a portion of the sample manipulator of the spectrometer shown in FIG. 12.

FIG. 17 is a perspective view of the sample manipulator 48 showing an optional system for heating or cooling the sample 78. Preferably, the sample 78 is heated by an electron gun which includes a tungsten filament (not shown) mounted behind sample 78 within the sample holder 59. Each end of the filament is connected to a respective lead 82. When current is passed through the filament via the leads 82, the filament becomes heated to incandescence. A potential is applied between sample surface 78 and the tungsten filament to cause electrons boiled off the heated filament to impact the sample 78. It is possible to heat the sample surface 78 to incandescence in this manner, both annealing it and cleaning it. The filament can preferably heat the sample surface 78 to approximately 2500° C.

Preferably, the sample 78 is cooled to below ambient temperature by a cooling fluid such as liquid nitrogen. This cooling fluid is introduced via cooling fluid conduits 100 which are coiled about the rod 19 of the sample manipulator 48. The coiled conduits 100 do not impede rotation of the rod 19 so the beam incident angle $\alpha$ may be varied by rotating the sample manipulator 48 about the axis of the rod 19. The cooling fluid conduits 100 carry cooling fluid both to and from a heat exchanger 102, which is preferably machined from a highly heat conductive material such as copper. Heat conductive braids 104 are preferably attached in good thermal contact to the heat exchanger 102. The heat conductive braids 104 are also preferably made of copper. These braids 104 are in thermal contact with the sample holder 59 to allow heat contained in the sample 78 and sample holder 59 to be conducted away from the sample 78 through the heat exchanger 102. The braids 104 are provided with sufficient slack to allow at least a limited rotation of the sample surface 78 so that the azimuthal angle $\delta$ may be changed. In the ultra-high vacuum of the vacuum chamber 12 it is contemplated that this technique can be used to cool the sample 78 to temperatures in the vicinity of −190° C.

Figure 18:
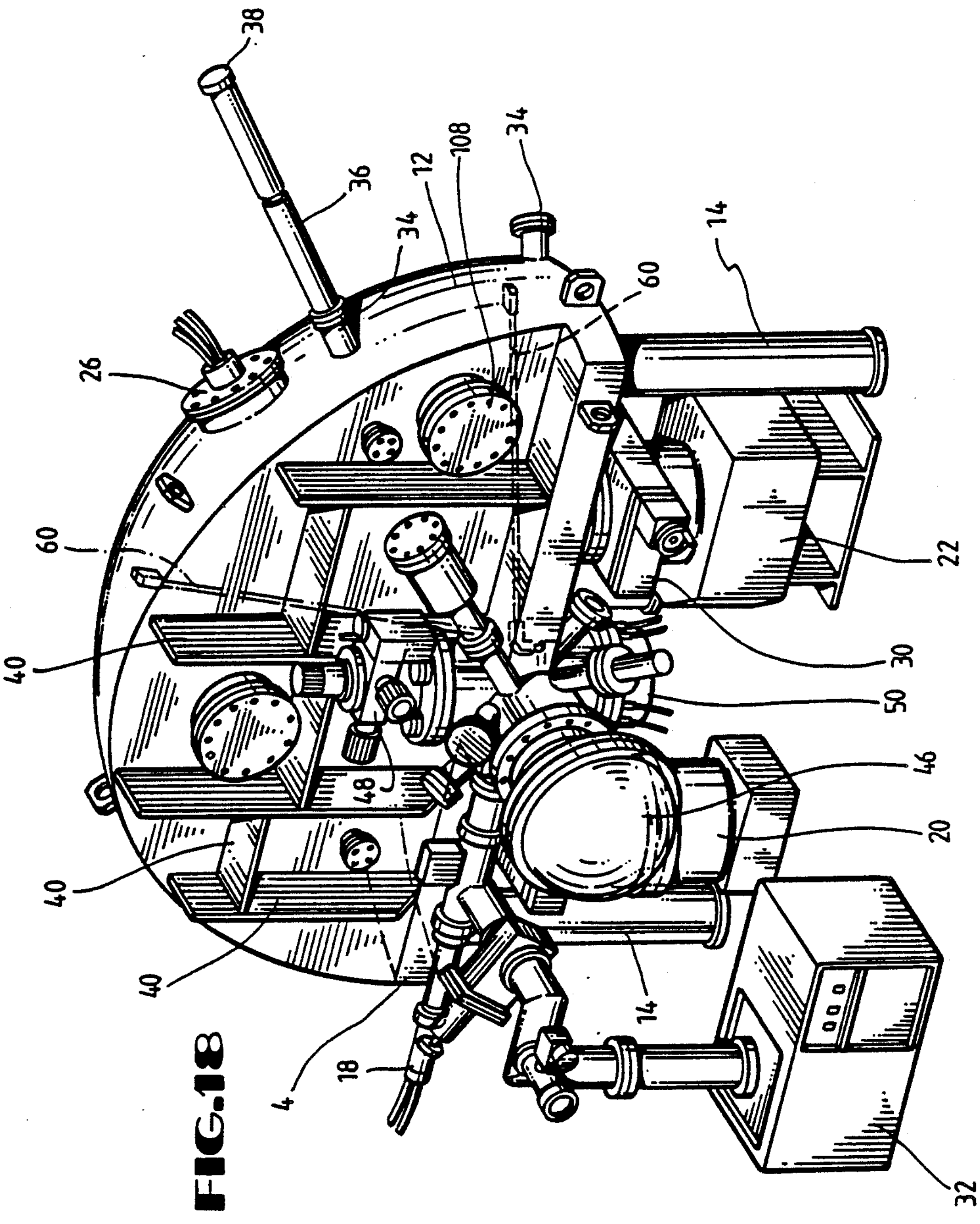
FIG. 18 is a perspective view of an alternative embodiment of the instrument of the present invention which permits the detection of both in-plane and out-of-plane scattering and recoiling.
Figure 19:
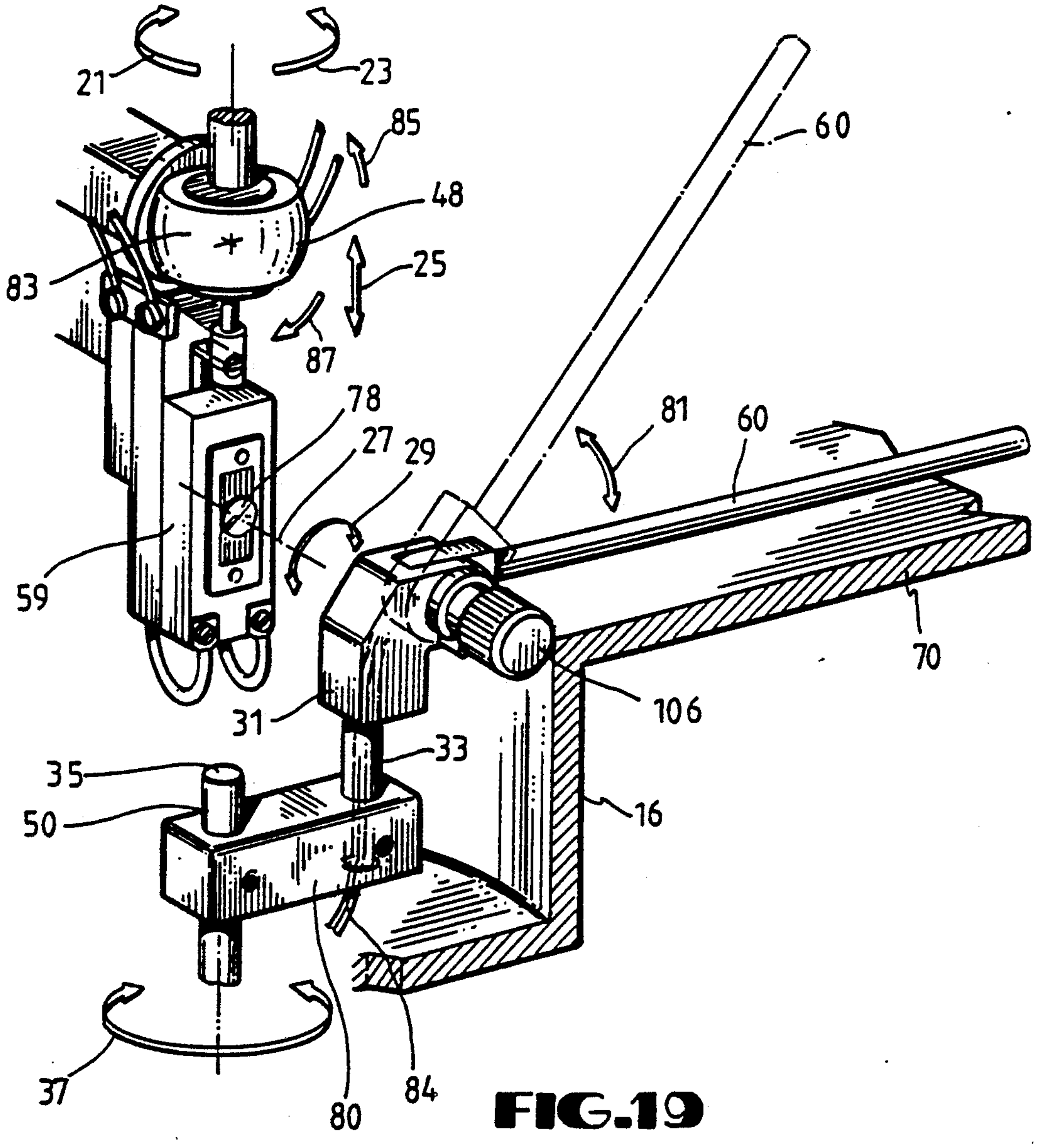
FIG. 19 is a cutaway view of the sample holder and detector positioner of the spectrometer illustrated in FIG. 18.

FIGS. 18 and 19 show an alternative embodiment of a spectrometer in accordance with the present invention. For ease of understanding and illustration, like reference numerals are used to designate elements similar to those previously described. The spectrometer 10 of FIG. 18 allows the detection of both scattered and recoiled particles both in-plane and out-of-plane. This is accomplished by providing a time-of-flight space which comprises approximately one-quarter of a sphere. The flight path space would be a perfect quarter sphere but for cutout 4 needed to accommodate the ion beam line 24. The spectrometer 10 is provided with an access port 108 which permits the detectors 74 and 76 (not shown in this figure) to be serviced.

FIG. 19 illustrates the positioning of the detector arm 60 for out-of-plane scattering. In addition to the range of motion previously described, the detector arm 60 used in the spherical spectrometer 10 of FIG. 18 may be moved with another degree of freedom. The detector arm 60 is elevated to the desired angle by a detector elevation adjuster 106, which could be a stepping motor or the like. The elevation adjuster 106 pivots the detector arm 60 in the direction of the curved arrow 81. Of course, the detector arm 60 continues to be pivotable about the rod 35 in the direction of the curved arrow 37.

The sample manipulator 48 is also mounted on a universal joint 83 that allows the sample to be moved in the direction of the arrows 85 and 87, in addition to the directions of arrows 21, 23 and 25.

For the spectrometer 10, the experimental parameters for scattering and recoiling are preferably as follows. A pulsed ion beam source having no neutrals and sharp energy distribution is preferably used. The beam energy may be varied between about 1 and 6 keV. Pulse widths between about 25 to about 50 nanoseconds at pulse rates between about 10 to about 40 KHz are used. The average current density is about 0.1 to about 0.5 $nA/cm^2$. The total primary ion dose is on the order of $10^{11}$ ions per square centimeter. The time-of-flight drift region is approximately 1 meter. Longer flight path lengths produce better resolution but increase the total evacuated volume thereby producing greater pumping requirements and necessitating greater structural reinforcement. It is contemplated that for adequate resolution of such species as oxygen and carbon, which commonly give relatively close time-of-flights due to their similar mass, a minimum path length of approximately 60 centimeters is required. For low energy ISS, flight times are on the order of microseconds and the difference in the time-of-flight over one meter for two such species would be on the order of 0.4 microseconds. Assuming a pulse width of approximately 50 nanoseconds (therefore each peak broadened by 50 nanoseconds) an absolute resolution of 0.1 microseconds is needed.

As briefly mentioned earlier with respect of FIG. 12, a number of auxiliary ports 2 are arrayed around the tee fitting 16 both above and below the vacuum chamber 12. In surface science analysis no single technique provides all the information the researcher would like to have. It is therefore a particular advantage of the spectrometer 10 that it allows additional surface analytical techniques to be incorporated. These ports 2 are used to mount auxiliary sources and detectors for conventional surface analytical techniques. Table I, below, contains a listing of some of the sources and detectors which may be mounted to the ports 2 for performing the techniques indicated in the table. For instance, as illustrated in FIG. 12, a quadrupole detector 54 used for mass spectrometric analysis of residual gases in the vacuum chamber 12 is attached to one of the ports 2. FIG. 12 also illustrates an x-ray source 56 being mounted on another of the auxiliary ports 2. The ports 2 are preferably at 45° to the plane of the vacuum chamber 12 such that they are aimed at the sample surface 78. Moreover, the spectrometer 10 can be constructed such that the ports 2 penetrate only the wall of the tee fitting 16, hence simplifying construction inasmuch as the intersection of the tee fitting 16 with the top and bottom plates 68 and 70 need not be machined to accommodate these ports 2.

TABLE I

| Technique | Source | Particle Detected | Analyzer |
|---|---|---|---|
| scattering | ion | scattered ion | TOF "drift space" |
| scattering | ion | scattered ion | electrostatic |
| scattering | ion | neutrals | TOF "drift space" |
| recoiling | ion | ions | TOF; ESA |
| recoiling | ion | neutrals | TOF "drift space" |
| Auger | electron | electron | ESA |
| Auger | ion | electron | ESA |
| XPS | x-ray | electron | ESA |
| UPS | uv* | electron | ESA |
| LEED | electron | electron | LEED optics |
| mass spec | electron bombardment | ions | quadrupole |

TABLE I-continued

ESA = electrostatic analyzer
(mass spectrometer function for residual gas analysis)
*Helium resonance lamp such as that described by Lancaster et al. in the Journal of Electron Spectroscopy and Related Phenomena, 14 (1978) 143-153, the teachings of which are incorporated by reference.

Unlike the other ports 2, a port 110 is preferably positioned at 30° to the plane of the top plate 68 and is somewhat larger than the other ports 2. The port 110 is used to mount a hemispherical analyzer 46, which is used to obtain kinetic energies of charged particles as indicated in item 18 of a Table II. It is also used to determine such things as the kinetic energies of ion beam induced Auger electrons and the kinetic energies of scattered, recoiled, and sputtered ions ejected as a result of ion or electron collisions. The hemispherical analyzer 46 is preferably of the electrostatic type. The analyzer 46 could also be mounted on the middle flange 13 of the tee fitting 16 which is frequently used to accommodate the view port 42, as illustrated in FIG. 1. The port 110 can also be used to accommodate reverse view LEED optics for low energy electron diffraction studies.

The kinetic energies of scattered ions from the pulse ion gun can be measured by reversing the polarities on the hemispherical analyzer and lens system. Kinetic energies of electrons ejected as a result of ion-surface collisions can be measured by using the pulsed ion beam, in either the pulsed or unpulsed mode, and the hemispherical analyzer.

Time-of-Flight (TOF) Scattering and Direct Recoiling

The technique of scattering and direct recoiling (DR) with analysis by TOF methods is an outgrowth of conventional ion-scattering spectrometry (ISS). The technique uses a pulsed primary ion beam, simultaneous TOF analysis of the scattered and DR particles, and a detector that is sensitive to both ions and fast neutrals, such as a channel electron multiplier. Since TOF analysis collects both neutrals and ions concurrently in a multichannel mode, it is $10^2$–$10^3$ times more sensitive than conventional ISS and spectra can be obtained with total ion doses of only about $10^{11}$ $ions/cm^2$. Therefore, the surface may be analyzed without extensive damage to the outermost monolayer.

A schematic diagram of this process, shown in FIG. 2, exhibits a typical TOF spectrum containing both the recoiled and scattered particle velocity distributions. DR atoms are those species that are recoiled into a forward direction from the surface as a result of quasi-direct collision of the primary ion. These DR species have sharp, high energy distributions, however, since they are predominantly neutrals, TOF techniques are used to analyze them efficiently. The DR process is extremely sensitive to light elements, e.g., H, C, N, and 0, on surfaces; impurity levels down to <1% of a monolayer can be observed which are not detectable by conventional Auger spectroscopy. The high sensitivity to surface hydrogen and the ability to quantitate its concentration makes DR spectrometry a unique technique for studying hydrogen on surfaces.

The Binary Collision Model

Scattering of ions with energies in the range 0.1 to 10 keV can be described very well by binary collisions between the incident ion and surface atoms. Due to the small de Broglie wavelength of the ion, the interaction can be treated classically and quantum effects can be neglected. A particle of energy $E_0$ and mass $M_1$ singly scattered (SS) from a surface atom of mass $M_2$ into a scattering angle $\theta$ will retain an energy $E_1$, as determined by the following equation:

$$E_1 = E_0(1+A)^{-2}[\cos\theta \pm (A^2 - \sin^2\theta)^{\frac{1}{2}}]^2 \qquad (2)$$

where $A = M_2/M_1$, and only the (+) sign applies for $A \geq 1$ and both (±) signs apply for $A < 1$. Multiple scattering (MS) sequences can be approximated by repeated application of equation (2). The energy $E_2$ of a target atom of mass $M_2$ which is directly recoiled from a primary ion is given by:

$$E_2 = E_0[4A/(1+A)^2]\cos^2\theta \qquad (3)$$

where $\phi$ is the angle between the direction of incidence of the primary ion and recoiling target atom. Through equations (2) and (3) the technique can be used for chemical analysis of elements on a surface. The TOF distributions are converted to energy distributions (see FIG. 3) for this purpose.

Comparison to Rutherford Backscattering (RBS)

The primary difference between TOF-SS/TOF-DR and Rutherford Backscattering Spectrometry (RBS) is that for the former $E_0$ is of the order of keV while in the latter $E_0$ is of the order of MeV. This gives rise to two important differences. First, in the low $E_0$ range, ions are scattered by relatively weak potentials and the radii of shadowing and blocking cones are comparable to interatomic spacings (≈1 Å). In the $E_0$ range of RBS, ions are only scattered by strong potentials and these radii are very small (≈0.1 Å). Second, the velocities of ions in the keV range are comparable to or smaller than the velocity of the valence electrons while the velocities of the ions in the MeV range are greater than the velocities of valence electrons. As a result, low $E_0$ ions with high ionization potentials pick up electrons near surfaces and are neutralized with high probability, and neutralization of high $E_0$ ions is negligible. Because of these differences, low $E_0$ scattering is extremely sensitive to the first one or two atomic layers of a surface while the sampling depth of RBS is of the order of micrometers. By using shadow and blocking analysis, low $E_0$ scattering and recoiling can be used for surface structure determinations whereas RBS is primarily a technique for bulk structural analysis.

Shadowing and Blocking Cones

The intensity distributions of scattered and recoiled atoms are not determined by the cross sections for elastic ion-atom scattering only. The repulsive scattering potential leads to a region behind each atom into which no ion can penetrate. This region, as illustrated in FIG. 4A, is called a shadow cone and atoms located inside the cone of another target atom cannot contribute to the scattering process. Atoms that are either scattered or recoiled from a surface can also be deflected by neighboring surface atoms. These deflections result in blocking cones about neighboring atoms which tend to limit atom ejection at specific angles as shown in FIG. 4A. The angles $\theta$ and $\phi$ and the energies $E_1$ and $E_2$ following a collision event can be expressed in terms of an impact parameter p, which is the distance of closest approach of the projectile and target atom if no scattering occurred. Ions with a small p are scattered through large angles while ions with a large p are only slightly deflected. This gives rise to the shadowing and blocking cones. If the angle $\theta$ is known as a function of p, the dimensions of the shadow cone can be calculated. Analytical formulas have been developed for calculating the dimensions of shadowing and cones in binary collisions. See, e.g., *Surface Sci.*, 141, 549 (1984). Since the dimensions of the cones for atoms in crystals are also dependent on the potentials of neighboring atoms, a higher degree of accuracy in analysis of the cones is obtained by calculating classical trajectories for the scattered and recoiled particles.

The neutralization probabilities of scattered ions are highest when their trajectories overlap with spatial regions of high electron density and lowest when their trajectories traverse regions of minimal electron density. By monitoring the backscattered and/or direct recoil ion fractions F as a function if $\alpha$, $\beta$, and $\delta$, contour plots of F can be obtained. These contour plots will be proportional to electron density through a function that relates neutralization probability to spatial electron density. Using the neutralization model that is presently available, the following analysis of an experiment can be given.

It has been shown that for keV ions, the electronic charge exchange processes with the surface that determine the scattered ion fractions can be partitioned into three segments of the classical trajectory, (i) the incoming trajectory, (ii) the close atomic encounter, and (iii) the outgoing trajectory. In (ii), charge exchange is by electron promotion in the molecular orbitals of the quasi-diatomic molecule formed in the collision. The degree of promotion is determined by the distance of closest approach or the impact parameter p. When ions are scattered at constant p (constant scattering angle $\theta$) and only the incident angle $\alpha$ is varied, the neutralization probability in (ii) is constant and only the probabilities of neutralization in segments (i) and (iii) will vary. In segments (i) and (iii), charge exchange processes are by means of resonant and Auger transitions while the particle is within 2–5 Å of the surface. These processes were originally treated by the neutralization model of Hagstrum which assumes that the rate of ion neutralization is given by Aexp(-as), where s is the perpendicular particle-surface distance and A and a are constants (*Phys. Rev.*, 96, 336 (1954); *Electron and Ion Spectroscopy of Solids*, Edited by L. Fiermans, J. Vennik, and W. Dekeyser, Plenum, NY (1978)). This model assumes that the ions "see" a smooth electron distribution outside the surface whose density depends only on the perpendicular distance of the ion from the surface. Godfrey and Woodruff have shown that this is a poor approximation and that ion neutralization at surfaces is more accurately described by considering the radial distance r between the ion and specific target atoms along the crystal azimuth, i.e., the neutralization probabilities were shown to be sensitive to the anisotropies of the spatial distributions of the electrons above the surface (*Surface Sci.*, 105, 438 (1981)). In segments (i) and (iii) we are concerned with trajectories that pass far enough away from the atom cores to suffer only minor deflections. These ion trajectories are treated as straight lines of constant velocity v which are characterized by the impact parameter p. If x is the distance along the ion trajectory relative to the point of closest approach to the atom, then $r = (x^2 + p^2)^{\frac{1}{2}}$. Under these conditions, the probability $P_{ion}$ that the ion will not be neutralized along the trajectory is given by:

$$P_{ion} = \exp\{(-2A/v)\exp[-a(x^2+p^2)^{\frac{1}{2}}]dx\} = \exp[-(2A/av)apK_1(ap)] \quad (4)$$

where $K_1$ is a modified Bessel function. $P_{ion}$ is therefore a unique function of p, the constants A and a, and the distance of closest approach (segment (ii)) for any specific ion-atom pairs. The parameters A and a have been estimated from experimental measurements. See, e.g., *J. Chem. Phys.*, 86, 2403-2410 (1987). Equation (4) can therefore be used to simulate the qualitative experimental contours that will be obtained. Although this analysis is almost certainly over simplified, it provides a starting point. It is contemplated that simple refinements, such as treating $P_{ion}$ as a function of the specific atomic orbitals (s,p,d,f) and the different atoms encountered along the trajectory, may be necessary to provide agreement with experiment.

If the experiment is performed with $\theta=165°$ as a function of $\alpha$, the scattered ion fraction will be minimum for those angles $\alpha$ where the beams travel though regions of high electron density, i.e., occupied orbitals. Along a given azimuth of the crystal, plots of F versus $\alpha$ will exhibit minima at $\alpha$ values corresponding to directions of high electron density and maxima at $\alpha$ values corresponding to directions of low electron density. Plots of F versus azimuthal angle $\delta$ at fixed $\alpha$ will exhibit minima along azimuths corresponding to high electron density.

Spatial distributions of surface electrons obtained from STM represent the electron densities at the Fermi level. In contrast, SREDS samples the entire valence electron density since resonant and Auger neutralization transition probabilities are dependent on the electron occupancy of the valence orbitals. It is also possible to measure the relative densities of these electron distributions from the absolute sizes of the F values. For example, the F values for projectiles whose trajectories are coincident with a dangling bond p-orbital projecting from a semiconductor surface which is occupied by either one or two electrons will differ. By calibration of F values on surfaces of clean metals and semiconductors for which electron distributions and orbital occupancies are known from band structure calculations, it should be possible to determine the electron occupancies of orbitals in more complex systems such as reconstructed surfaces, alloys, mixed semiconductors, and adsorbate/-surface systems.

Since these electron distributions will often be determined from measurements with a scattering angle of about 165°, there is a possibility that the 15° spread between the incoming and outgoing beam will broaden the angular anisotropies measured for the occupied orbitals. This problem can be handled, in a first-order approximation, according to the model described above. It is contemplated that the observed ion fractions for such a backscattering angle will be more sensitive to the outgoing trajectory rather than the incoming trajectory. The reason for this is that in such a collision, the projectile transfers a very large fraction of its kinetic energy resulting in an outgoing velocity that is much lower than the incoming velocity. From equation (4), the ion survival probability $P_{min}$ for charge exchange is proportional to $\exp[-C/v]$, where C is a constant. Since the outgoing velocity is much slower than the incoming velocity, neutralization along the outgoing trajectory will dominate in defining the electron density distributions. For example, for an Ar/W or Ne/Ni collision with $\theta=165°$, the velocity of the scattered particle is 0.65 or 0.50, respectively, of the incoming velocity. Using the exponential dependence on 1/v, the probability of neutralization along the outgoing trajectory will be respectively, 1.7 and 2.7 times the probability along the incoming trajectory.

Such contours allow one to observe shifts in electron densities as a result of adsorption on surfaces and possibly to determine which specific types of substrate orbitals are involved in the adsorption bonds. For example, on a clean transition metal surface, the d-band is normally highly localized about the atom while the sp-band is more delocalized. One might expect the d-band to produce large anisotropies in the F behavior and the sp-band to produce a more isotropic effect on F. It is contemplated that when atoms are adsorbed on this surface, electron density shifts will be observed due to the extra electrons introduced by the adsorbate and the polarization effects on the metal electrons. Electronegative adsorbates should polarize the highly itinerant sp-electrons so that they are relatively localized near the adsorbate atoms and electropositive adsorbate should have the opposite effect. The addition of extra electrons and the polarization effects can be separated as follows. The anisotropies in the electrons introduced by the adsorbate can be studied by measuring the direct recoil (DR) ion fractions as a function of $\beta$ and $\delta$. The polarization effects on the metal electrons can be studied by measuring the projectile ion fractions resulting from only single scattering (SS) collisions. These DR and SS events can be easily resolved in TOF experiments by judicious choice of parameters, as has been demonstrated for many different systems. In order to quantify this effect, initial measurements should be compared to published band structure calculations and molecular orbital calculations that describe electron densities on surfaces.

Surface Structural and Electron Density Photograms

It was shown above that interatomic distances can be obtained by measuring the single scattering intensity I(SS) as a function of incident angle $\alpha$ along different azimuths. Also, measurements of direct recoil intensity I(DR) as a function of either incident angle $\alpha$ or elevation angle $\beta$ along different azimuths reveal the location of light adsorbates. By plotting I(SS) or I(DR) on a two-dimensional diagram of $\alpha$ or $\beta$ versus azimuthal angle $\delta$ while keeping $\theta$ constant, structural contour maps of the surface can be obtained. These structural contour maps are representative of specific crystal faces and specific adsorbate geometries or site positions on a surface. They provide quantitative information, however, they serve as a fingerprint of a specific surface structure or adsorbate ordering in much the same way that LEED can provide qualitative structures. The advantages over LEED are that (i) a "real space", and hence simpler, image of the structure is obtained, and (ii) light adsorbates such as hydrogen can be efficiently detected. Quantitative information can be obtained from analyses such as those described above. Structural photograms can be made from the structural contour maps by assigning different colors to different ranges of I(SS) and I(DR) values. These photograms provide distinctive images of various surface structural arrangements. Black and white photograms can be obtained by assigning different shades of grey to the intensity ranges.

It was shown above that anisotropies in surface electron density can be detected by monitoring the scattered ion fraction F as a function of $\alpha$ along different azimuths. By plotting F on a two-dimensional diagram of $\alpha$ versus $\delta$ while keeping $\theta$ constant, electron density contour maps of the surface can be obtained. These maps are representative of the electron density anisotropies above specific crystal faces and the modifications in these electron densities caused by adsorbates. They can serve as fingerprints of electron density contours of specific surface and adsorbate structures in a manner similar to STM. The advantage over STM is that the contours represent the entire valence electron density protruding above the surface. Electron density photograms can be made from these contour maps in the same manner as described above for the structural photograms.

Simultaneous Recoiling and Scattering (SRS) for Analysis of Adsorbed Hydrogen Simultaneous recoiling and scattering (SRS) is a variation of SREDS that is particularly powerful for studying surface hydrogen. The technique is as follows. Consider hydrogen bound to a substrate surface atom. The hydrogen can be recoiled into a forward angle using a heavy projectile and the projectile will only suffer a minor deflection. This projectile then continues to scatter from the heavy substrate surface atoms in a manner that is indistinguishable from scattering on the clean surface. Both the recoiled hydrogen and the scattered projectile are detected in the same TOF spectrum and structural photograms of the recoiled hydrogen and the scattered projectile can be obtained from a single set of measurements. Comparison of the scattering structural photograms for the clean and hydrogen covered surfaces can reveal the influence of hydrogen on the substrate surface structure. It is well known that some reconstructed semiconductor surfaces can be converted to the bulk structure by adsorption of hydrogen.

As an example of SRS, one can calculate that primary $Ar^+$ ions are deflected by only 1.2° from their trajectories in collisions with hydrogen atoms which result in recoil of the hydrogen at 60°. The $Ar^+$ loses only 2.4% of its kinetic energy in such a collision. Using 5 keV $Ar^+$ projectiles, the H(DR) energy is 120 eV while the energy retained by $Ar^+$ is 4.88 keV. Since the $Ar^+$ is essentially undeflected, it scatters from the substrate atom to which the hydrogen is bound. This simultaneous detection method can be especially useful in analysis of hydrogen on substrate consisting of more than one element, e.g., alloys, mixed semiconductors, and salts. Since the structural photogram for the hydrogen covered surface can be made by selecting the TOF peak corresponding to scattering from a specific substrate atom, SRS is capable of determining the specific surface atoms to which hydrogen is bound. In a variation of this, detection of the recoiled and scattered particles in coincidence allows absolute determination of hydrogen binding partners.

Site Specific Adsorption Binding Energies and Kinetics

Site specific adsorption binding energies and kinetics can be obtained from SREDS in a manner similar to that already demonstrated for hydrogen on stepped Pt(S)−[9(111)×(111)] and oxygen on Cu(100). See *Phys. Rev. Letters*, 56, 1152 (1986) and *Nucl. Instrum. Methods*, B9, 277 (1985). Although these studies were successful in demonstrating the value of ion-scattering for determination of these properties, they detected only ions, and hence did not have the requisite sensitivity for a non-destructive analysis. The following alternative technique is now enabled. Selected combinations of $\alpha$, $\beta$, $\delta$ and $\theta$ can be chosen such that only adsorbates at selected geometrical site positions on the surface can be recoiled. The adsorbate (N+I) direct recoil yield for each of these different combinations can be measured as a function of sample temperature for a fixed equilibrium adsorbate pressure in the chamber. The resulting plots of the adsorbate (DR) yield versus temperature produces isobars for each different structural site. From this data, it is possible to plot isosteres as ln P vs. 1/T at constant adsorbate coverage. The binding energy (or isosteric heat of adsorption) for each equilibrium adsorbate pressure can be calculated from the slopes of the isosteres. From such measurements over the range $160° \leqq T \leqq 420°$ K and $H_2$ equilibrium pressures of $1.6\times10^{-5}$ to $0.8\times10^{-2}$ pa, Koeleman, et al. showed that the binding energy of hydrogen on step Pt sites is 93 kJ/M and coverage independent while on terrace sites it is initially 75 kJ/M and decreases with increasing coverage to 58 kJ/M (*Nucl. Instrum. Methods*, 218, 225 (1983)).

Kinetic studies utilizing the site specific capabilities of SREDS can be carried out in a manner similar to the binding energy studies described above. In this case adsorbate (DR) intensities are monitored as a function of adsorbate exposure in order to obtain sticking probabilities for the specific adsorption sites. This data can be used to model the adsorption process at different sites. It has been shown that the (DR) intensities can be used to determine the nature of the adsorption sites, i.e., either one- or two-site models.

SREDS - Scattering and Recoiling for Electron Distributions and Structure

The SREDS technique offers the following advantages: (a) the structural and electron density analyses are in real space; (b) ion doses of only about $10^{11}$ ions/cm$^2$ are required for analysis; (c) the technique is sensitive to all elements, including extremely high sensitivity to hydrogen, which is difficult to analyze by other surface techniques; (d) interatomic distances in surfaces can be determined to ±0.01 Å; (e) atomic structure and electron distribution effects on scattered and recoiled ion fractions can be separated; (f) electron density contours above surfaces can be determined from the ion fraction behavior; (g) atomic structure and electron density contours can be determined in a single experiment allowing direct superposition of the electron densities on the structural model; and (h) metal, semiconductor, and insulator surfaces can be investigated.

The SREDS technique can be illustrated with the following data taken using either of the spectrometers 10. It is important to appreciate that atomic structure information is obtained by observing a collision with the core, i.e., atomic position is the determining factor. The ion fraction or the neutralization probability is dependent on the amount of electron density the ion travels through in getting to the core and bouncing back out, i.e., the probability of the ion encountering an electron which will neutralize it.

One can obtain an ion fraction spectrum F as a function of time-of-flight (or $E_1/E_0$) The ion fractions obtained in this manner are totally independent of atomic structure; they are dependent only on the valence electron densities above the surface. In order to obtain backscattering at a backscattering angle approaching 180°, an ion must hit the surface atom nearly head-on. A head-on collision yields an impact parameter p of essentially zero. The impact parameter p is defined as the perpendicular distance of the target atom from the undeflected trajectory of the incident ions. Scattering cross section is a function of p. For forward scattering, the impact parameter p is large. However, the impact parameter p equals zero in a head-on collision producing 180° backscattering. This gives exact atomic site information, such as atomic resolution. To observe only single scattering one need only select the proper time window for the appropriate time-of-flight range. For example, as shown in FIG. 11, to observe hydrogen one would look in a time window over the interval designated h. Therefore one can selectively observe only collisions with surface hydrogen atoms and thus obtain position information on the hydrogen atoms.

Typical time-of-flight spectra and corresponding energy distributions are shown in FIGS. 3A and 3B, respectively. The deconvoluted single scattering (SS), multiple scattering (MS), penetration scattering (PS), direct recoil (DR), and surface recoil (SR) components are shown. The ordinate is flux density, i.e., scattered and recoiled particle intensity. The flux density of the neutral particles is dependent on how many positive ions bounce off of the sample surface after being neutralized by the sample 78. The flux of neutral particles is a function of electron density, e.g., how many electrons the scattered particle travels through in getting to the core and bouncing back. Electron density is determined by the electron distributions (orbitals) extend above the sample surface 78. The distance of closest approach in keV ion collisions is on the order of a few tenths of an angstrom.

The spectrometer 10 can continuously and independently vary the incident angle $\alpha$, the azimuthal angle $\delta$, and the scattering angle $\theta$. For instance, varying the azimuthal angle $\delta$ allows the surface 78 to be studied along different crystallographic directions as is illustrated in the top view of FIG. 7. Single crystal samples of known structure and order can be used to provide particularly interesting scattering and recoiling data inasmuch as the beam incident and azimuthal angles can be related to known features of the structure. For purposes of example, the surface 78 is a tungsten (211) surface having oxygen and hydrogen chemisorbed thereon. The tungsten (211) surface was chosen because it exhibits a high degree of surface symmetry and it has been extensively studied so its structure is well known. Tungsten exhibits a "row-trough surface", which is defined by close packed rows 61 separated by broad and deep valleys 63, as shown in the views of FIG. 7. The top view shows various azimuths, and the bottom view is a cross-sectional illustration taken along a plane perpendicular to the surface. Top layer atoms are depicted with open circles, second layer atoms are depicted with dotted circles, and third and fourth layer atoms are depicted as hatched circles. The circles approximate the covalent radius of the tungsten atoms.

If an azimuthal angle $\delta$ along the (111) direction, i.e., along the rows 61, is chosen, the distance between the atoms in the rows 61 is only 2.74 angstroms. Therefore, a certain minimum incident angle $\alpha$ at which there will be shadowing and no single scattering will be observed. In contrast, if an azimuthal angle $\delta$ is chosen perpendicular to the rows 61, such as along the (011) direction, the distance between the atoms is 4.48 angstroms. Therefore, a different minimum incident angle $\alpha$ at which one begins to observe single scattering from the top row atoms will be observed.

At a higher incident angle $\alpha$, scattering from the second row of atoms will be observed. This phenomenon is illustrated in the trajectories depicted in FIGS. 5A and B for values of $\alpha$ equal to 21°, 26°, 27°, 46°, and 49°. The dots in FIGS. 5A and 5B indicate atom cores. At incident angles $\alpha$ equal to 21° and 26°, there are overlapping shadow cones on adjacent atoms so complete backscattering is not obtained. At 27° complete backscattering is obtained. Trajectories shown for ions incident along the (113) azimuth of the tungsten (211) crystal are shown in FIG. 5B. Trajectories for those first and second row atoms can be seen in this figure. At 49°, backscattering from the second row begins to be observed. At a lower angle, such as 46°, backscattering from the second row is not observed.

After these angles have been measured, a trajectory calculation can be performed as illustrated in FIGS. 6A and 6B. The radius of the shadow cone R at a distance L behind the target atom is calculated using the following equations:

$$L = d \cos \alpha_{min}, \text{ and } R = d \sin \alpha_{min}, \quad (5)$$

where $\alpha_{min}$ is the beam incidence angle $\alpha$ at which one first begins to observe single scattering. A shadow cone is a region behind the target atom into which primary ions do not penetrate because of the repulsion forces. At the onset of single scattering, the edge of the shadow cone overlaps the adjacent atom. Detection of direct recoils overcomes the problem with light atoms having very low scattering cross-sections. By measuring $\alpha_{min}$ and $\beta_{min}$, the interatomic distance d can be determined as $d = r/\sin \beta_{min}$. As is readily apparent, if R, $\alpha$, and L are known, it is possible to calculate the interatomic spacing d. FIG. 6B also shows blocking cones.

Figure 8A:
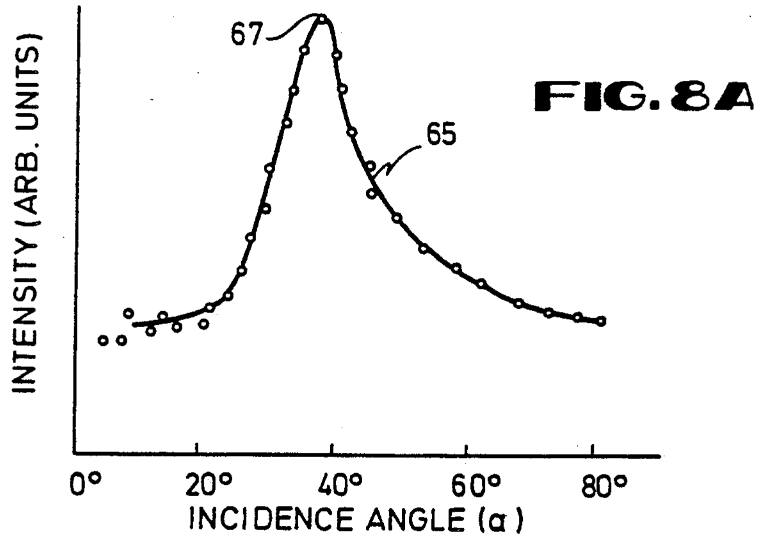
FIGS. 8A–C shows plots of scattered Ar(N+I) intensity as a function of incidence angle $\alpha$ for 4 keV $Ar^+$ on a W(211) surface along the three different azimuths indicated in FIG. 7.
Figure 8B:
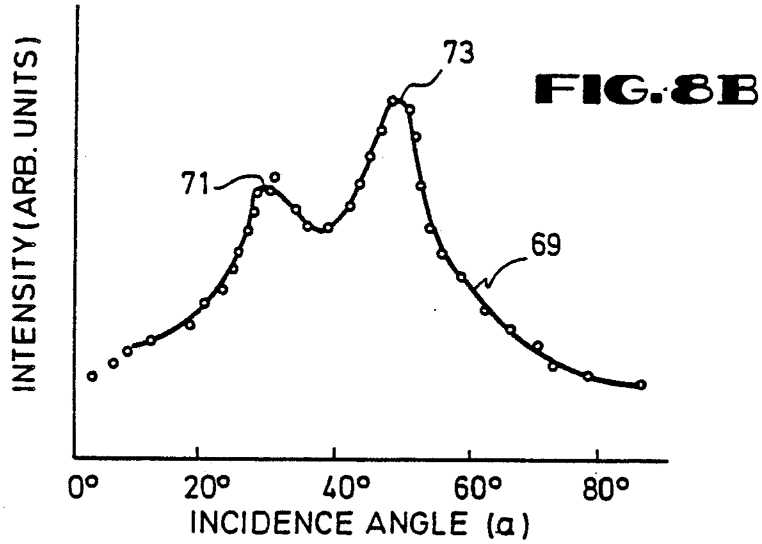
Figure 8C:
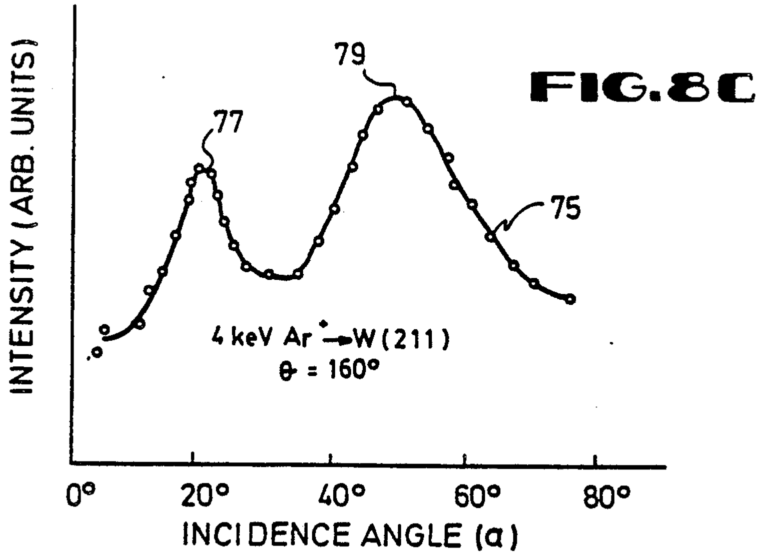

FIG. 8 depicts plots of scattered argon intensity (neutrals plus ions) as a function of azimuthal angle $\delta$ for 4 keV $Ar^+$ impinging on the tungsten (211) surface along the three different azimuths defined in FIG. 7A. The plots for the different azimuths are indicated by the crystallographic pattern numbers in the upper right corner of each panel. FIG. 8 shows experimental measurements of these angles. The curve 65 that represents the scattered argon intensity along the (111) azimuth exhibits a single peak 67. The sharply rising portion of curve 65 is when overlap of the shadow cone on the neighboring atom is first observed. Along the (011) direction, the curve 69 exhibits two peaks 71 and 73. The first peak 71 at the low angle is due to the beginning of single scattering from first layer atoms. The second peak 73 is due to the beginning of scattering from second row atoms. The curve 75 that represents the scattered argon intensity along the (113) azimuth exhibits two peaks 77 and 79. The sharply rising portion of each of the peaks 77 and 79 is at a different angle than that for the (011) azimuth, reflecting the difference in interatomic spacings along those two azimuths.

It should be noted that x-ray diffraction patterns for conventional crystallographic determination of structure are often ambiguous. For example, for the tungsten (211) surface it can be found by x-ray crystallography that the rows are either in a particular direction or 90° to that direction, but the technique cannot unambiguously differentiate between those two possibilities. In contrast, the technique of the present invention provides unambiguous data as to which direction the rows run.

Structure Analysis of Adsorbates on a Surface

FIG. 9B depicts a top and end view of the tungsten (211) surface having oxygen chemisorbed thereon. For simplicity, the reference numerals for the elements of FIG. 7 are used in FIG. 9 to designate similar elements. FIG. 9B schematically shows five geometrically different adsorbate site positions: the oxygen atoms labeled a and b are in symmetrical trough sites while those labeled b', c and d are in asymmetrical trough sites. In this context, the term "asymmetrical" means the oxygen atoms are not equidistant between the top rows 61 of tungsten atoms. It has been shown by LEED analysis that oxygen goes into the troughs 63 on the row-trough surface of the tungsten (211) crystal when it chemisorbs on such a surface.

Intensity of recoiled oxygen versus azimuthal angle $\delta$ is shown in the top panel of FIG. 9A. If the incident beam is directed at 90° to the rows 61, the recoiled oxygen has zero intensity, indicating that the adsorbed oxygen must be in the troughs 63. If the azimuthal angle $\delta$ is parallel to the rows 61, the oxygen atoms are recoiled from the troughs 63. At the zero angle position, a small minimum is observed which has two maxima 15° on either side. Thus, the oxygen is not at a symmetrical position between the two rows. If it were at a symmetrical position, such as position a or b, one would expect to observe a maximum in the recoil intensity on axis $\delta=0$. The maxima at 15° on either side of the axial position indicates that the oxygen atoms must be chemisorbed at one of the asymmetrical sites shown in FIG. 9B. The other spectral structure seen in FIG. 9A can be simulated by doing the full three-dimensional trajectory calculations and determining at which angles maxima and minima are observed in the recoils. It is contemplated that a full analysis will enable one to determine exactly which of the asymmetrical sites the oxygen is chemisorbed to, inasmuch as all are geometrically different.

In the case of hydrogen (lower panel of FIG. 9A), it is not known whether the hydrogen is chemisorbed to symmetrical or asymmetrical positions. Low intensity is observed at $\delta=90°$ which immediately indicates that it must be chemisorbed in the troughs 63. However, unlike the oxygen chemisorption case, a maximum is observed at $\delta=0$. This indicates that there is more hydrogen in a symmetrical position than in an asymmetrical position. The fact that other maxima are observed in the spectrum at exactly the same positions as that for oxygen (with the exception of the maxima at 15° for the case of chemisorbed oxygen indicates that the hydrogen is most likely at both symmetrical and asymmetrical sites since it is known that oxygen is only at the asymmetrical sites. It is contemplated that this could also be simulated by doing the full trajectory calculations.

Electron Density Determination

By collecting ion fraction data in the same experiment used for atomic structure determinations, electron density for a clean surface can be compared to electron density for an adsorbate-covered surface. The differences between the spectra of the clean and adsorbate-covered surfaces can be used to determine how certain adsorbates polarize the surface electron density. That data must be consistent with the atomic structure determination. Stated another way, if it were determined that hydrogen were adsorbed only at position d in FIG. 9B, then the electron density information must be consistent with that if the whole picture is correct. This comprises a self-checking mechanism for the procedure. One obtains two different sets of information which must be consistent with each other if they are in fact correct. A change in electron distribution corresponding to specific adsorbate sites should be observed if the atomic structure determination is correct.

Electronic structure on surfaces (electron density contours) is difficult to obtain. Such contours have recently become available by the technique of scanning tunneling microscopy (STM). This technique was introduced in 1982 (*Appl. Phys. Letters*, 40, 178 (1982)). There are two problems with this technique: (1) It measures electron density at the Fermi level; thus, one obtains a contour only those electrons with the Fermi energy which are only a small portion of the total valence electrons. (2) No information is obtained from this technique about atomic structure. Atomic site positions must be inferred from an analysis of the electron distributions. This is an indirect determination of atomic positions and as a result one cannot obtain accurate atomic structures by this technique. Moreover, this technique is limited to conductive surfaces.

The SREDS technique overcomes these shortcomings. It samples electron density at all valence electrons, not merely those of the Fermi level. Because the ion neutralization mechanism is by resonant and Auger neutralization, the neutralization processes sample the whole valence band electron density. Also, insulators may be used as samples since the sample surface can be kept neutral by using an electron flood gun. The SREDS technique does not have severe charging problems because a pulsed ion beam is used at a relatively low current. Therefore, a large surface charge is not created. The features of the spectrometer 10 which enable both atomic structure and electron density determinations to be performed are (1) time-of-flight energy analysis, at a long enough path length for adequate resolution, and (2) a continuously variable scattering angle.

Unlike the instruments of the prior art, the spectrometer 10 allows a continuous variation of almost 180° of the scattering angle $\theta$ (for in-plane scattering). If both the beam incident angle $\alpha$ and the azimuthal angle $\delta$ were fixed and only the scattering angle $\theta$ were varied, the changes in behavior of scattering as a function of the impact parameter p would be observed. Thus, the flux observed will be an exact representation of the scattering cross-sections and recoil cross-sections modified by the shadowing and blocking effects. At forward angles, direct recoils and scattering can be detected. As a scattering angle $\theta$ of 90° is approached, the intensity of the direct recoils increases because its cross-section increases and the scattering intensity decreases because its cross-section decreases. At 90°, the direct recoils have an infinite cross-section but they cannot be observed because they have zero energy. Also at 90°, surface recoil begins to be observed. As the backscattering angles are approached, mainly single scattering and much less multiple scattering is observed. Instruments of the prior art which had fixed scattering angles had to rely on empirical data to select the scattering angle for observation. The spectrometer 10 has no such limitation. Only the locations of the flight path extension tubes 36 are fixed and the locations of the extension ports 34 can be chosen in much the same manner as scattering angles were chosen for instruments of the prior art. These angles are chosen to maximize sensitivity and resolution while still maintaining high kinetic energy for the recoiled and scattered particles.

Thus, the SREDS technique which is made possible by the time-of-flight, ion-scattering spectrometer 10 disclosed herein provides at least two different types of information—surface structure information and information about surface electron density. Surface structure analysis is performed by shadowing and blocking analysis. This gives information on the location of atoms in or on a surface. This instrument and technique possess the unique ability to detect hydrogen. Conventional ISS cannot detect hydrogen because hydrogen is a light atom and has a very low scattering cross section. Therefore, the incident beam is not scattered appreciably off a surface hydrogen atom. In the present instrument, hydrogen can be detected with very high sensitivity by observing recoiling. The ability to combine both the scattering and recoiling is particularly important for hydrogen because prior to the present invention there were no good techniques for the detection of hydrogen adsorbed on a surface. Hydrogen is analyzed by direct recoiling DR rather than scattering. Time-of-flight analysis is needed for the detection of hydrogen by DR inasmuch as almost 100% of the recoils are neutral species. Other light adsorbates such as carbon and oxygen are difficult to analyze by ISS, but are amenable to DR because they have low scattering cross sections. These light adsorbates are important for studying phenomenon such as chemisorption, catalysis, reactions of hydrocarbons on surfaces, etc. Hydrogen analysis is very important for studying stress corrosion and cracking in steels, embrittlement, the storage of hydrogen in materials, and the penetration of hydrogen into materials.

The second aspect of complete surface analysis is electron density analysis. Aono demonstrated that this could be done but he was unable to separate surface structure effects from electron density effects since his experiment detected only charged species. Using the SREDS technique and spectrometer 10, all of this information, and a clean separation of these two effects, may be obtained in a single experiment.

The SREDS method may be used to take a single crystal and map out atomic structure and then map out electronic structure, superimpose the two and thereby get a full picture of the atomic plus electronic structure on that structure. It is also contemplated that the spectrometer 10 and the SREDS method can be used to generate structural and electron density photograms, two-dimensional pictures of atomic structure plus electronic structure on an atomic scale.

The make and model of various components used in the illustrated embodiment is shown below in Table II.

TABLE II

| | Component | Company & Model No. | Specifics |
|---|---|---|---|
| 1. | ion gun filament | Perkin-Elmer Co. Model No. 04-191 | a. off-axis (no fast neutrals) b. 0–5 keV ions |
| 2. | sample manipulator | Vacuum Generators Model No. HPT (high precision XYZ translator | four degrees of freedom for precision sample movement |
| 3. | main chamber ion pump | Perkin-Elmer Co. Model 222-0400 | pumps hydrogen efficiently (500 l/sec) |
| 4. | main chamber turbomolecular pump | Leybold-Heraeus, Inc. Model TMP-450 | handles heavy gas loads (450 l/sec) |
| 5. | gate valves | Varian Vac. Co. Model 951-5218 | bakeable |
| 6. | turbomolecular pump for differential pumping of ion source | Leybold-Heraeus, Inc. Model TMP-150 | |
| 7. | pulse generator | Hewlett-Packard Model 214B | 0–100 v sharp pulses |
| 8. | timing electronics | EG&G Ortec | |
| a. | time-to-amplitude converter | Model 467 | |
| b. | timing amplifier | Model 574 | |
| c. | gate & delay generator | Model 416B | |
| d. | electron multipler supply | Model 459 | |
| e. | constant fraction discriminator | Model 473A | |
| f. | timer-counter | Model 871 | |
| 9. | pulse height analyzer | EG&G Ortec | Multichannel capability |
| 10. | rotary motion feedthrough for detector | Huntington Model PR-275 | <0.1~ accuracy |
| 11. | detector | Galileo Electro Optics Model 4219 | sensitive to both ions and fast neutrals |
| 12. | dual sorption pumps for rough- | Varian Vac. Co. Model 941-6501 | rough down from 1 atm to 1 micron |

TABLE II-continued

| | Component | Company & Model No. | Specifics |
|---|---|---|---|
| | ing down chamber | | |
| 13. | residual gas analyzer mass spectrometer | Electronic Assoc., Inc. Model Quad 150 | determines background gases |
| 14. | strip heaters for chamber baking | Watt-Low, Inc. | heaters are glued to chamber walls |
| 15. | ionization and thermocouple gauges | Perkin-Elmer Co. Monitor Model 300 | for measuring vacuum |
| 16. | leak valves for gas inlet | Varian Vac. Co. Model 951-5100 | variable leak |
| 17. | bakeable valve for isolation of roughing line | Varian Vac. Co. Model 951-5027 | |
| 18. | hemispherical electrostatic analyzer | Microscience, Inc. Model HA100 | voltage reversible for measuring both electrons & ions |
| 19. | x-ray source | Microscience, Inc. Model TA10 | for XPS |
| 20. | electron gun | Microscience, Inc. Model EG5 | for AES |
| 21. | IBM-AT computer | IBM Corp. | data acquisition in pulse height analysis mode |

What is claimed is:

1. A time-of-flight ion-scattering spectrometer comprising:

an ultra-high vacuum chamber; and at least one tube having a first end portion and a second end portion, said first end portion being coupled to said vacuum chamber and said second end portion extending outwardly from said vacuum chamber, said second end portion being adapted to house a time-of-flight detector.

2. The spectrometer, as set forth in claim 1, wherein said vacuum chamber comprises:

a top plate and a bottom plate, said top plate and said bottom plate being connected together by a wall, said top plate and said bottom plate having a substantially semicircular periphery having a substantially straight base portion and a substantially curved portion.

3. The spectrometer, as set forth in claim 2, wherein said vacuum chamber further comprises:

a fitting being connected to the base portion of said vacuum chamber, said fitting being adapted to connect to (i) a sample manipulator being adapted to position a sample within said vacuum chamber, and to (ii) a detector positioner being adapted to position a detector within said vacuum chamber at a plurality of locations with respect to said sample.

4. The spectrometer, as set forth in claim 1, wherein said vacuum chamber further comprises:

a port on said vacuum chamber being adapted to operably connect a pump to said vacuum chamber, said pump being adapted to evacuate said vacuum chamber.

5. The spectrometer, as set forth in claim 1, wherein said vacuum chamber further comprises:

a port on said vacuum chamber being adapted to connect an ion beam source to said vacuum chamber.

6. A time-of-flight ion-scattering spectrometer comprising:

a vacuum chamber having a top plate and a bottom plate, said top plate and said bottom plate being connected together by a wall, said top plate and said bottom plate having a substantially semicircular periphery having a substantially straight base portion and a substantially curved portion; and a fitting being connected to the base portion of said vacuum chamber, said fitting being adapted to connect to (i) a sample manipulator being adapted to position a sample within said vacuum chamber, and to (ii) a detector positioner being adapted to position a detector within said vacuum chamber at a plurality of locations with respect to said sample.

7. The spectrometer, as set forth in claim 6, further comprising:

a port being adapted to operably connect to a pump, said pump being adapted to evacuate said vacuum chamber.

8. The spectrometer, as set forth in claim 6, further comprising:

a port being adapted to connect to an ion beam source and being positioned to direct an ion beam emitted from said ion beam source to said sample.

9. The spectrometer, as set forth in claim 6, wherein said fitting comprises:

a plurality of auxiliary ports being adapted for connecting selected instruments to said fitting.

10. The spectrometer, as set forth in claim 9, wherein said auxiliary ports position said selected instruments connected thereto in communication with said vacuum chamber.

11. A time-of-flight ion-scattering spectrometer comprising:

a vacuum chamber;

means for selectively positioning a sample having a surface to be analyzed within said vacuum chamber;

means for delivering an ion beam onto said surface at an incidence angle $\alpha$, said incidence angle being defined between said ion beam and a line projected perpendicularly onto said surface from said ion beam; and means for detecting both ions and neutral particles emanating from said surface in response to said ion beam striking said surface, said detecting means being adapted to detect said ions and neutral particles at continuously variable scattering angles form 0° to approximately 170° $\theta$, said scattering angles $\theta$ being defined between a flight path of said emanated particle and said surface.

12. The spectrometer, as set forth in claim 11, wherein said positioning means comprises:

a sample manipulator adapted to be connected within said vacuum chamber.

13. The spectrometer, as set forth in claim 12, wherein said sample manipulator comprises:

means for holding said sample in a position intersecting said ion beam;

means for pivoting said sample about a first axis to selectively alter said incidence angle $\alpha$; and means for pivoting said sample about a second axis to selectively alter an azimuthal angle $\delta$, said azimuthal angle $\delta$ being defined between a predetermined line on aid surface and a line projected perpendicularly onto said surface from said ion beam.

14. The spectrometer, as set forth in claim 12, wherein said sample manipulator comprises:

means for heating said sample.

15. The spectrometer, as set forth in claim 14, wherein said heating means comprises:

a filament positioned adjacent said sample; and means for applying an electrical potential across said filament, thereby heating said filament.

16. The spectrometer, as set forth in claim 12, wherein said sample manipulator comprises:

means of cooling said sample.

17. The spectrometer, as set forth in claim 16, wherein said cooling means comprises:

a heat exchanger being disposed in thermal contact with said sample manipulator;

a conduit being connected to said heat exchanger and being adapted for carrying fluid to and from said heat exchanger.

18. The spectrometer, as set forth in claim 17, wherein said conduit is coiled about said sample manipulator.

19. The spectrometer, as set forth in claim 11, wherein said delivering means comprises:

an ion gun being adapted for producing said ion beam;

an ion beam line having an aperture therein; and a pulse plate being disposed in said ion beam line, said pulse plate being adapted for receiving said ion beam and sweeping said ion beam across said aperture in response to a voltage having a preselected magnitude being applied to said pulse plate, each sweep producing an ion beam pulse which impinges on said surface.

20. The spectrometer, as set forth in claim 11, wherein said detecting means comprises:

a detector positioner adapted to be connected within said vacuum chamber.

21. The spectrometer, as set forth in claim 20, wherein said detector positioner comprises:

an arm having a first end portion and a second end portion, said first end portion being pivotally connected proximate said sample thereby allowing said second end portion to pivot about said sample.

22. The spectrometer, as set forth in claim 21, wherein said detecting means further comprises;

a detector being connected to said second end portion of said arm and being moveable therewith.

23. The spectrometer, as set forth in claim 22, wherein said detector senses both ions and neutral particles emanating from said surface.

24. The spectrometer, as set forth in claim 23, wherein said detecting means further comprises:

means for selectively substantially preventing said detector from sensing said ions.

25. The spectrometer, as set forth in claim 24, wherein said preventing means comprises:

a deflector plate being disposed on said second end portion of said arm, said deflector plate deflecting ions from said detector in response to a voltage having a magnitude greater than a predetermined magnitude applied thereto and said deflector plate passing ions to said detector in response to an absence of said voltage.

26. The spectrometer, as set forth in claim 25, wherein pivotal movement of said arm moves said detector through a predetermined range of scattering angles $\theta$.

27. A time-of-flight ion-scattering spectrometer comprising:

a vacuum chamber;

a sample manipulator adapted to be connected within said vacuum chamber, said sample manipulator being adapted to selectively position a sample in said vacuum chamber;

an ion beam source being adapted to direct and ion beam onto said sample;

a first detector;

a first detector positioner being adapted to be connected with said vacuum chamber, said first detector positioner being adapted to selectively position said first detector along approximately 170° of angular path at a preselected distance from said sample;

a second detector; and a second detector positioner being adapted to be connected to said vacuum chamber, said second detector positioner being adapted to selectively position said second detector along a straight path at a preselected angle with respect to said ion beam.

28. The spectrometer, as set forth in claim 27, wherein said vacuum chamber comprises:

a top plate and a bottom plate, said top plate and said bottom plate being connected together by a wall, said top plate and said bottom plate having a substantially semicircular periphery having a substantially straight base portion and a substantially curved portion.

29. The spectrometer, as set forth in claim 28, wherein said vacuum chamber further comprises:

a fitting being connected to the base portion of said vacuum chamber, said fitting being adapted to connect to said sample manipulator and to said first detector positioner.

30. The spectrometer, as set forth in claim 27, wherein said first detector positioner comprises:

an arm having a first end portion and a second end portion, said first end portion being pivotally connected proximate said sample thereby allowing said second end portion to pivot about said sample.

31. The spectrometer, as set forth in claim 30, wherein said first detector is connected to said second end portion of said arm and is moveable therewith.

32. The spectrometer, as set forth in claim 31, wherein said first detector senses both ions and neutral particles emanating from said surface.

33. The spectrometer, as set forth in claim 32, wherein said first detector positioner further comprises:

means for selectively substantially preventing said first detector from sensing said ions.

34. The spectrometer, as set forth in claim 33, wherein said preventing means comprises:

a deflector plate being disposed on said second end portion of said arm, said deflector plate deflecting ions from said first detector in response to a voltage having a magnitude greater than a predetermined magnitude applied thereto and said deflector plate passing ions to said first detector in response to an absence of said voltage.

35. The spectrometer, as set forth in claim 27, wherein said second detector positioner comprises:

a tube having a first end portion and a second end portion, said first end portion being connected to said vacuum chamber and said second end portion being connected to said second detector;

said tube being positioned along a radial path from said sample with said first end portion being radially inward and said second end portion being radially outward.

36. A time-of-flight ion-scattering spectrometer comprising:

a vacuum chamber;

at least one tube-like member having a first and second end portion, said first end portion being coupled to said vacuum chamber and said second end portion extending outwardly from said vacuum chamber, said second end portion being adapted to house a first time-of-flight detector; and a detector manipulator being adapted to be connected within said vacuum chamber and to selectively position a second time-of-flight detector along an angular path with respect to a sample.

37. The spectrometer, as set forth in claim 36, wherein said detector manipulator is adapted to selectively position said second time-of-flight detector along said angular path at both continuously variable forward scattering and backscattering angles.

38. The spectrometer, as set forth in claim 36, wherein said detector manipulator comprises:

an arm having a first end portion and a second end portion, said first end portion being pivotally connected proximate said sample thereby allowing said second end portion to pivot about said sample.

39. The spectrometer, as set forth in claim 38, wherein said time-of-flight detectors are adapted for detecting both ions and neutral particles.

40. The spectrometer, as set forth in claim 39, wherein each of said time-of-flight detectors comprises means for selectively substantially preventing said respective detector from sensing said ions.

41. The spectrometer, as set forth in claim 36, wherein said preventing means corresponding to said second time-of-flight detector comprises:

a deflector plate being disposed on said second end portion of said arm, said deflector plate deflecting ions from said detector in response to a voltage having a magnitude greater than a predetermined magnitude applied thereto and said deflector plate passing ions to said detector in response to an absence of said voltage.

* * * * *

UNITED STATES PATENT AND TRADEMARK OFFICE
CERTIFICATE OF CORRECTION

PATENT NO. : 5,068,535

DATED : November 26, 1991

INVENTOR(S) : J. Wayne Rabalais

It is certified that error appears in the above-identified patent and that said Letters Patent are hereby corrected as shown below:

In column 3, line 37, after "ions," insert -- shadowing effects and --.

In column 29, line 16, delete "aid" and insert -- said --, therefor.

In column 32, line 21, delete "36" and insert -- 40 --, therefor.

Signed and Sealed this

Sixth Day of April, 1993

*Attest:*

STEPHEN G. KUNIN

*Attesting Officer*

*Acting Commissioner of Patents and Trademarks*